United States Patent
Gupta

(10) Patent No.: US 6,795,002 B2
(45) Date of Patent: Sep. 21, 2004

(54) GAIN SCALING FOR HIGHER SIGNAL-TO-NOISE RATIOS IN MULTISTAGE, MULTI-BIT DELTA SIGMA MODULATORS

(75) Inventor: Sandeep K. Gupta, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/326,706

(22) Filed: Dec. 23, 2002

(65) Prior Publication Data

US 2003/0085826 A1 May 8, 2003

Related U.S. Application Data

(63) Continuation-in-part of application No. 10/043,229, filed on Jan. 14, 2002.

(60) Provisional application No. 60/261,224, filed on Jan. 12, 2001.

(30) Foreign Application Priority Data

Jan. 14, 2002 (WO) .............................. PCT/US02/00537

(51) Int. Cl.[7] .................................................. H03M 3/00
(52) U.S. Cl. ...................................... 341/143; 341/155
(58) Field of Search .................................. 341/143, 155

(56) References Cited

U.S. PATENT DOCUMENTS

| | | | | |
|---|---|---|---|---|
| 4,862,169 A | * | 8/1989 | van Bavel et al. | 341/143 |
| 4,876,542 A | * | 10/1989 | van Bavel et al. | 341/143 |
| 5,061,928 A | * | 10/1991 | Karema et al. | 341/143 |
| 5,103,229 A | * | 4/1992 | Ribner | 341/143 |
| 5,142,286 A | | 8/1992 | Ribner et al. | |
| 5,153,593 A | * | 10/1992 | Walden et al. | 341/143 |
| 5,283,578 A | * | 2/1994 | Ribner et al. | 341/143 |
| 5,329,282 A | | 7/1994 | Jackson | |
| 5,414,424 A | | 5/1995 | Cabler | |
| 5,500,645 A | * | 3/1996 | Ribner et al. | 341/143 |
| 5,654,711 A | | 8/1997 | Fujimori | |
| 5,760,722 A | | 6/1998 | Harris et al. | |
| 5,838,270 A | | 11/1998 | Kiriaki | |
| 5,959,562 A | | 9/1999 | Wiesbauer | |
| 5,999,564 A | | 12/1999 | Dagdeviren | |
| 6,107,950 A | | 8/2000 | Fisher et al. | |
| 6,300,892 B2 | | 10/2001 | Braun | |

FOREIGN PATENT DOCUMENTS

| | | | | |
|---|---|---|---|---|
| EP | 0 454 406 A1 | 10/1991 | ............ | H03M/3/02 |
| EP | 0 457 429 A2 | 11/1991 | ............ | H03M/3/02 |

OTHER PUBLICATIONS

Adams, R. W., "The Design of High–Order Single–Bit Delta–Sigma ADCs," from Norsworthy, S. R. et al. (editors), Delta–Sigma Converters, IEEE Press, pp. v–xiv and 165–281 (1997).*

(List continued on next page.)

*Primary Examiner*—Michael Toker
*Assistant Examiner*—Khai Nguyen
(74) *Attorney, Agent, or Firm*—Sterne, Kessler, Goldstein & Fox P.L.L.C.

(57) ABSTRACT

An n-bit quantizer of a downstream modulator stage is configured to produce an n-bit quantized signal from an analog signal having a range. The n-bit quantizer divides the range into $2^n$ subranges. A first subrange of the $2^n$ subranges is bounded by a lowest value of the range, a second subrange of the $2^n$ subranges is bounded by a highest value of the range, and at least one remaining subrange of the $2^n$ subranges is positioned between the first and the second subranges. The first and the second subranges each measure greater than $\{1/[2(2^n-1)]\}$ of the total range. Each of the at least one remaining subrange measures less than $[1/(2^n-1)]$ of the total range. A first gain of an integrator of the downstream modulator stage is set so that the downstream modulator stage is stable. A second gain of a stability correction gain element of a coupling stage connected to the downstream modulator is set so that a swing of the analog signal remains within a dynamic range of the downstream modulator stage.

27 Claims, 17 Drawing Sheets

OTHER PUBLICATIONS

Adams, R.W., "The Design of High–Order Single–Bit ΔΣ ADCs," from Norsworthy, S.R. et al. (editors), *Delta–Sigma Data Converters*, IEEE press, pp. v–xiv and 165–281 (1997).

Aziz, P.M. et al., "An Overview of Sigma–Delta Converters," *IEEE Signal Processing Magazine*, IEEE, pp. 61–84 (Jan. 1996).

Brandy, B.P. and Wooley, B.A., "A 50–MHz Multibit Sigma–Delta Modulator for 12–b 2–MHz A/D Conversion," *IEEE Journal of Solid–State Circuits*, IEEE, vol. 26, No. 12, pp. 1746–1756 (Dec. 1991).

Candy, J.C., *An Overview of Basic Concepts*, from Norsworthy, S.R. et al. (editors), *Delta–Sigma Data Converters*, IEEE Press, pp. v–xiv and 1–43 (1997).

Carley, L.R., "A Noise–Shaping Coder Topology for 15+ Bit Converters," *IEEE Journal of Solid–State Circuits*, IEEE, vol. 24, No. 2, pp. 267–273 (Apr. 1989).

*DSPatch*, Special Reprint Edition, Analog Devices, Inc., 16 pages (Winter 1990.

Marques, A. et al., "Optimal Parameters for ΔΣ Modular Topologies," *IEEE Transactions on Circuits and Systems–II: Analog and Digital Signal Processing*, IEEE, vol. 45, No. 9, pp. 1232–1241 (Sep. 1998).

Noriega, G., *Sigma–Delta A/D Converters—Audio and Medium Bandwidths*, RMS Instruments, from http://www.rmsinst.com/dt3.htm, 7 pages (Feb. 1996).

Ribner, D.R., "A Comparison of Modulator Networks for High–Order Oversampled ΣΔ Analog–to–Digital Converters," *IEEE Transactions on Circuits and Systems*, IEEE Circuits and Systems Society, vol. 38, No. 2, pp. 145–159 (Feb. 1991).

U.S. patent application Ser. No. 10/043,229, Gupta, filed Jan. 14, 2002.

del Rio, R. et al., "High–Order Cascade Multibit ΣΔ Modulators fpr xDSL Applications," *IEEE International Symposium on Circuits and Systems*, IEEE, May 28–31, 2000, pp. 11–37 to 11–40.

Marques, A. et al., "Optimal Parameters for ΔΣ Modulator Topologies," *IEEE Transactions on Circuits and Systems— II. Analog and Digital Signal Processing*, IEEE, vol. 45, No. 9, Sep. 1998, pp. 1232–1241.

Copy of International Search Report for Appln. No. PCT/US02/00537, mailed Dec. 9, 2003, 7 pages.

* cited by examiner

2300

2302 CONFIGURE AN N-BIT QUANTIZER OF A DOWNSTREAM MODULATOR STAGE TO PRODUCE AN N-BIT QUANTIZED SIGNAL FROM AN ANALOG SIGNAL HAVING A RANGE SUCH THAT THE N-BIT QUANTIZER DIVIDES THE RANGE INTO $2^n$ SUBRANGES, WHEREIN A FIRST SUBRANGE OF THE $2^n$ SUBRANGES IS BOUNDED BY A LOWEST VALUE OF THE RANGE, A SECOND SUBRANGE OF THE $2^n$ SUBRANGES IS BOUNDED BY A HIGHEST VALUE OF THE RANGE, AND AT LEAST ONE REMAINING SUBRANGE OF THE $2^n$ SUBRANGES IS POSITIONED BETWEEN THE FIRST AND SECOND SUBRANGES, EACH OF THE AT LEAST ONE REMAINING SUBRANGE MEASURING LESS THAN $[1/(2^n-1)]$ OF THE RANGE

2304 SET A FIRST GAIN OF AN INTEGRATOR OF THE DOWNSTREAM MODULATOR STAGE SO THAT THE DOWNSTREAM MODULATOR STAGE IS STABLE

2306 SET A SECOND GAIN OF A STABILITY CORRECTION GAIN ELEMENT OF A COUPLING STAGE CONNECTED TO THE DOWNSTREAM MODULATOR STAGE SO THAT A SWING OF THE ANALOG SIGNAL REMAINS WITHIN A DYNAMIC RANGE OF THE DOWNSTREAM MODULATOR STAGE

GAIN SCALING FOR HIGHER SIGNAL-TO-NOISE RATIOS IN MULTISTAGE, MULTI-BIT DELTA SIGMA MODULATORS

CROSS-REFERENCE TO RELATED APPLICATIONS

This application is a continuation-in-part of U.S. application Ser. No. 10/043,229, filed Jan. 14, 2002, which claims the benefit of U.S. Provisional Application No. 60/261,224, filed Jan. 12, 2001, both of which are incorporated herein by reference in their entirety.

BACKGROUND OF THE INVENTION

1. Field of the Invention

The present invention relates to gain scaling of multistage, multi-bit delta sigma modulators for higher signal-to-noise ratios.

2. Background Art

Commercialization of the Internet has proven to be a mainspring for incentives to improve network technologies. Development programs have pursued various approaches including strategies to leverage use of the existing Public Switched Telephone Network and plans to expand use of wireless technologies for networking applications. Both of these approaches (and others) entail the conversion of data between analog and digital formats. Therefore, it is expected that analog-to-digital converters (ADCs) and digital-to-analog converters (DACs) will continue to perform critical functions in many network applications.

FIG. 1 shows a process for converting an analog signal "x[n]" 102 to a digital signal "z[n]" 104 using an exemplary ADC 106. ADC 106 receives analog signal x[n] 102 and produces digital signal z[n] 104. Analog signal x[n] 102 comprises variations of a parameter (e.g., voltage) continuously with time. The variations in the parameter of analog signal x[n] 102 are maintained within a range between a lower value "LOW" 108 and a higher value "HIGH" 110. This is referred to as the "swing" of analog signal x[n] 102. Typically, analog signal x[n] 102 is characterized by a carrier frequency. Digital signal z[n] 104 comprises a sequence of discrete quantized values that, over time, tracks the parameter variations of analog signal x[n] 102. Typically, the quantized values of digital signal z[n] 104 are represented by binary numbers. A maximum value "MAX" 112 is defined by the number of different quantized values that can be produced by ADC 106.

FIG. 2 is a block diagram of ADC 106. ADC 106 comprises a sampling functional component 202 and a quantization functional component 204. Sampling functional component 202 records, at a sampling frequency, discrete values of analog signal x[n] 102. Typically, the sampling frequency is greater than or equal to the Nyquist frequency, which is twice the carrier frequency of analog signal x[n] 102. Quantization functional component 204 assigns a quantized value to represent each discrete sampled value, thereby producing digital signal z[n] 104.

The difference between digital signal z[n] 104 and analog signal x[n] 102 is referred to as quantization error e[n]. Ideally, there is a direct relationship between the values of analog signal x[n] 102 and digital signal z[n] 104 at corresponding points in time. In reality, the use of a limited number of quantized values for digital signal z[n] 104 dictates that, in some instances, values of analog signal x[n] 102 must be approximated. It is desirable to minimize quantization error e[n], which is an unwanted byproduct of the quantization process.

FIG. 3 illustrates the process within quantization functional component 204. The range of parameter variations of analog signal x[n] 102 is divided into a number of equal-sized subranges. The number of equal-sized subranges is defined by the value of MAX 112. If, for example, MAX 112 equals four, then the range of parameter variations of analog signal x[n] 102 is divided into four subranges, each measuring one-quarter of the range between LOW 108 and HIGH 110. A subrange "A" 302 extends from LOW 108 to a value at a point "Q1" 304. A subrange "B" 306 extends from Q1 304 to a value at a point "Q2" 308. A subrange "C" 310 extends from Q2 308 to a value at a point "Q3" 312. A subrange "D" 314 extends from Q3 312 to HIGH 110.

Both analog signal x[n] 102 and digital signal z[n] 104 are usually biased by specific values that can obscure the underlying relationship between the two signals. This relationship is more readily explained when analog signal x[n] 102 is understood to be centered at a point measuring one-half of the range between LOW 108 and HIGH 110. In the present example, this point is Q2 308. By translating the actual value of Q2 308 to zero and the remaining points in analog signal x[n] 102 accordingly, the bias value is removed from analog signal x[n] 102. Therefore, quantized values derived from this translated analog signal x[n] 102 correspond to digital signal z[n] 104 with its bias value removed.

FIG. 9 is a graph 900 of bias-free values of quantized signal y[n] 828, produced by single-bit quantizer 814, as a function of bias-free values of analog signal x[n] 102. With analog signal x[n] 102 centered at a point measuring one-half of the range between LOW 108 and HIGH 110 (e.g., point Q2 308 from the example above), quantizer 814 divides analog signal x[n] 102 into two subranges. Quantizer 814 assigns a lower value "LOWER" 902 to those values of analog signal x[n] 102 that are less than the midpoint (e.g., Q2 308) value, and a higher value "HIGHER" 904 to those values of analog signal x[n] 102 that are greater than the midpoint (e.g., Q2 308) value. Typically, LOWER 902 is the lowest quantized value and HIGHER 904 is the highest quantized value that can be produced by quantizer 814.

The number of subranges determines the degree of resolution of ADC 106. Degree of resolution is typically expressed as the number of binary digits (i.e., bits) in the quantized values that can be produced by ADC 106. ADC 106 is characterized by its sampling frequency and its degree of resolution. The ability of ADC 106 to digitize analog signal x[n] 102 faithfully is a direct function of both of these. As the sampling frequency is increased, analog signal x[n] 102 is sampled at more points in time. As the degree of resolution is refined, the differences between digital signal z[n] 104 and analog signal x[n] 102 are minimized.

FIG. 4 is a graph 400 of bias-free values of digital signal z[n] 104 as a function of bias-free values of analog signal x[n] 102. A dashed line 402 represents the ideal direct relationship between the values of analog signal x[n] 102 and digital signal z[n] 104. The slope of dashed line 402 corresponds to the gain of ADC 106. A shaded portion 404 between graph 400 and dashed line 402 corresponds to quantization error e[n]. The same error pattern applies to each subrange. The measure of each subrange is referred to as the measure of a Least Significant Bit (LSB).

Statistical methods are often used to analyze quantization error e[n]. FIG. 5 is a graph 500 of a probability density "P(p)" 502 of a subrange of digital signal z[n] 104 as a function of the parameter "p" 504 of analog signal x[n] 102. Probability density P(p) 502 is centered at the midpoint of the subrange (i.e., at a 316, b 318, c 320, or d 322). Probability density P(p) 502 corresponds to quantization error e[n]. Probability density P(p) 502 shows that digital signal z[n] 104 has the same value throughout the subrange, where the subrange extends on either side of its midpoint for a measure equal to one-half of the LSB. The constant value of digital signal z[n] 104 within each subrange and its relation ship to quantization error e[n] is also shown by graph 400.

Further analysis of quantization error e[n] is often performed in the frequency domain. FIG. 6 is a graph 600 of probability density P(p) 502 in the frequency domain. Graph 600 shows an "absolute value of p" 602 as a function of frequency "freq" 604. In the frequency domain, quantization error e[n] is recast as quantization noise n[n]. Quantization noise n[n] has a constant value for all frequencies. This is referred to as "white noise." The white noise of ADC 106 is directly proportional to the measure of the LSB and indirectly proportional to the square root of the sampling frequency. Thus, quantization noise n[n] (and, by transformation, quantization error e[n]) can be minimized by increasing sampling frequency or decreasing the measure of the LSB. The measure of the LSB can be reduced by increasing the number of subranges into which the range of analog signal x[n] 102 is divided (i.e., increasing the number of bits that can be produced by ADC 106).

Because ADCs find uses in a wide variety of applications, design of these circuits has evolved along many paths to yield several distinct architectures, including "flash," "pipelined," "successive approximation," and "delta sigma." These designs are well known to those skilled in the art and their functional components vary in some respects from those of exemplary ADC 106. Each architecture has its benefits and drawbacks. Paramount among these is a tradeoff between bandwidth and degree of resolution. FIG. 7 is a graph 700 that shows the tradeoff between bandwidth and degree of resolution for the various ADC architectures. Graph 700 comprises a "degree of resolution" axis 702 and a "bandwidth" axis 704. The relative positions of the different ADC architectures are plotted with respect to axes 702, 704: a "flash" region 706, a "pipelined" region 708, a "successive approximation" region 710, and a "delta sigma" region 712.

In the design of network technologies, data conversion has often presented itself as a bottleneck that impedes the rate at which information is transmitted. Traditionally, those ADC architectures that can support large bandwidths for rapid transfers of data have been favored for network applications. Because much of the circuitry of a delta sigma ADC architecture is analog, its bandwidth is limited by the processing speed of its analog circuits.

However, emerging applications, such as full-motion video and voice over Internet, require high resolution data conversion. Fortunately, improvements in the methods of fabricating integrated electronic circuits have increased not only the processing speed and number of devices, but also the variety of devices (such as linear capacitors) that can be fabricated on a given area of substrate material. Delta sigma ADCs have benefitted from these developments, which have facilitated the use of delta sigma ADCs in network applications.

FIG. 8 is a block diagram of a first-order, single-stage, single-bit delta sigma ADC 800. ADC 800 comprises a first-order, single-stage, single-bit delta sigma modulator 802 and a digital decimator 804 connected at a node "$N_O$" 806 along a signal path 808. Modulator 802 comprises a summing node "$\Sigma_0$" 810, an integrator 812, a single-bit quantizer 814, and a DAC 816. Summing node $\Sigma_0$ 810, integrator 812, and quantizer 814 are connected, respectively, in series along signal path 808. Integrator 812 has a gain "$a_1$". Gain $a_1$ is determined empirically and is set to a value such that modulator 802 functions with stability to process analog signal x[n] 102. Typically, gain $a_1$ has a value between zero and one. DAC 816 is connected in parallel with signal path 808 between node $N_O$ 806 and summing node $\Sigma_0$ 810. Decimator 804 comprises a lowpass digital filter 818 and a downsampler 820 connected, respectively, in series along signal path 808. Analog signal x[n] 102 is received by ADC 800, at an input 822, and converted into digital signal z[n] 104, produced at an output 824.

Initially, analog signal x[n] 102 passes through summing node $\Sigma_0$ 810 and is sampled by integrator 812. Integrator 812 integrates analog signal x[n] 102 over a given period of time to produce an integrated signal "v[n]" 826. Integrated signal v[n] 826 is transmitted to single-bit quantizer 814. Single-bit quantizer 814 rounds integrated signal v[n] 826 to the closest of two preset levels (i.e., a single bit) to produce a quantized signal "y[n]" 828. To minimize the difference between quantized signal y[n] 828 and analog signal x[n] 102, quantized signal y[n] 824 is transmitted to DAC 816 and converted to produce an analog feedback signal "fbk[n]" 830, which is fed back to summing node $\Sigma_0$ 810. Quantizer 814 and DAC 816 have a combined gain "$k_1$" defined as shown in Eq. (1):

$$k_1 = fbk[n]/v[n],\qquad\text{Eq. (1)}$$

where both analog feedback signal fbk[n] 830 and integrated signal v[n] 826 are analog signals.

At summing node $\Sigma_0$ 810, analog feedback signal fbk[n] 830 is subtracted from analog signal x[n] 102 to produce an analog difference signal "u[n]" 832. Analog difference signal u[n] 832 passes into integrator 812 to repeat the process described above. Essentially, integrator 812 integrates the difference between quantized signal y[n] 828 and analog signal x[n] 102. Over a large number of samples, integrator 812 forces this difference to approach zero. Thus, analog signal x[n] 102 is received by modulator 802, at input 822, and converted into quantized signal y[n] 828, produced at node $N_O$ 806. Input 822 is an input and node $N_O$ 806 is an output of modulator 802.

FIG. 9 is a graph 900 of bias-free values of quantized signal y[n] 828, produced by single-bit quantizer 814, as a function of bias-free values of analog signal x[n] 102. With analog signal x[n] 102 centered at a point measuring one-half of the range between LOW 108 and HIGH 110 (e.g., point Q2 308 from the example above), quantizer 814 divides analog signal x[n] 102 into two subranges. Quantizer 814 assigns a lower value "LOWER" 902 to those values of analog signal x[n] 102 that are less than the midpoint (e.g., Q2 308) value, and a higher value "HIGHER" 904 to those values of analog signal x[n] 102 that are greater than the midpoint (e.g., Q2 308) value. Typically, LOWER 902 is the lowest quantized value and HIGHER 904 is the highest quantized value that can be produced by quantizer 814.

Returning to FIG. 8, quantized signal y[n] 828 from modulator 802 comprises a stream of quantized values. Each quantized value is either LOWER 902 or HIGHER 904 (i.e., a single bit of resolution). Typically, this stream is produced at a modulator frequency that is several times greater than the carrier frequency of analog signal x[n] 102. The ratio of the modulator frequency to the Nyquist frequency is referred to as the oversampling ratio (OSR).

Decimator 804 acts to lowpass filter and downsample quantized signal y[n] 828. Quantized signal y[n] 828 is transmitted to lowpass digital filter 818, which performs a sophisticated form of averaging on the data stream to produce a high resolution signal "w[n]" 834. A maximum value "MAXIMUM" is defined by the number of different quantized values that can be produced by filter 818. High resolution signal w[n] 834 also comprises a stream of quantized values. However, each quantized value can be any of the different quantized values (i.e., multiple bits of resolution) that can be produced by filter 818.

High resolution signal w[n] 834 emerges from filter 818 at a frequency too high for subsequent digital signal processing. High resolution signal w[n] 834 is transmitted to downsampler 820, which resamples high resolution signal w[n] 834 to produce digital signal z[n] 104. Digital signal z[n] 104 enjoys the same high resolution as high resolution signal w[n] 834, but at a digital processing frequency. Typically, the digital processing frequency is greater than or equal to the Nyquist frequency. Thus, quantized signal y[n] 828 is received by decimator 804, at node $N_0$ 806, and converted into digital signal z[n] 104, produced at output 824. Node $N_0$ 806 is an input and output 824 is an output of decimator 804.

The usefulness of the high resolution of ADC 800 turns on its ability to minimize quantization noise n, which is an unwanted byproduct of the quantization process. Fortunately, it is a feature of modulator 802 that it acts as a highpass filter for quantization noise n, much of which can be removed by lowpass digital filter 818. This capability is more readily explained by analyzing modulator 802 in the frequency domain.

FIG. 10 is a block diagram of first-order, single-stage, single-bit delta sigma modulator 802 recast as a frequency domain model 1000 for a continuous time implementation. In model 1000, integrator 812 is replaced by an analog filter 1002 with gain $a_1$, single-bit quantizer 814 is replaced by a gain element 1004 connected in series with a second summing node "$\Sigma_1$" 1006. (First summing node $\Sigma_0$ 810 remains a component of model 1000.) A quantization noise "n" 1008 is added at second summing node $\Sigma_1$ 1006. DAC 816 is replaced by a parallel connection "$L_0$" 1010 between node $N_0$ 806 and summing node $\Sigma_0$ 810. Combined gain $k_1$ of quantizer 814 and DAC 816 is realized by assigning gain $k_1$ to gain element 1004 and a gain of one to $L_0$ 1010.

In model 1000, analog signal x 102 initially passes through summing node $\Sigma_0$ 810 and into analog filter 1002. Analog filter 1002 has a transfer function with an amplitude that is inversely proportional to a frequency "f" of analog signal x 102 as shown in Eq. (2):

$$v = a_1 u/f.\qquad\text{Eq. (2)}$$

Single-bit quantizer 814 is modeled as gain element 1004 connected in series with second summing node $\Sigma_1$ 1006 to reflect the concept of treating quantization noise n 1008 as an unwanted byproduct of the quantization process. A transfer function of single-bit quantizer 814 can be expressed as shown in Eq. (3):

$$y = vk_1 + n.\qquad\text{Eq. (3)}$$

In reality, both gain $k_1$ and quantization noise n 1008 are unknown. Because single-bit quantizer 814 does not produce any quantized values that are in between LOWER 902 and HIGHER 904 (its lowest and highest quantized values), gain $k_1$ is essentially indeterminate. However, for analysis purposes, it is desirable to model quantization noise n 1008 as white noise and to set an overall gain of modulator 802, the product of gain $a_1$ and gain $k_1$, equal to one. Both of these attributes can be realized for analysis purposes by assuming that $k_1 = 1/a_1$.

In modulator 802, the addition of quantization noise n 1008 after integrator 812, but before production of analog feedback signal fbk 830 enables modulator 802 to shape quantization noise n 1008 as a function of frequency f. Quantized signal y 828 as a function of frequency f can be expressed as shown in Eq. (4):

$$y = [x + nf]/[f+1].\qquad\text{Eq. (4)}$$

Eq. (4) shows that modulator 802 acts as a highpass filter for quantization noise n 1008. The coupling of modulator 802 with lowpass digital filter 818 of decimator 804 enables ADC 800 to enjoy a relatively high signal-to-noise ratio (SNR) in comparison with other ADC architectures. As a "rule of thumb", the SNR for ADC 800 improves by 9 dB for every doubling of its OSR.

SNR is an important figure of merit for ADC performance. Improvements in the methods of fabricating integrated electronic circuits have reduced the size of electron devices. This has enabled ADC 800 to be designed to consume less power. However, reduced power consumption is often realized in part by using lower power supply voltages. Integrator 812 is implemented using an operational amplifier. Because some of the range between supply voltages to an operational amplifier must be consumed to support holding active load devices and current sources in saturation, only the remaining portion of this range is available for the output swing of the operational amplifier. This remaining portion is referred to as the dynamic range of the operational amplifier. So that ADC 800 does not suffer from nonidealities caused by the operational amplifier that implements integrator 812, it is important that the swing of integrated signal x[n] 826 remain within the dynamic range of the operational amplifier.

Two other important figures of merit for ADC performance are dynamic range (DR) and overload level (OL). DR, which is different from the dynamic range of the operational amplifier used to implement integrator 812, is the maximum SNR achievable for a given ADC topology. Typically, the swing of analog signal x[n] 102 is maintained within a range. Measures of the SNR vary as a function of the measure of this range. OL is the maximum range at which the SNR degrades to 6 dB less than its DR value. FIG. 11 is a graph 1100 of the "SNR" 1102 as a function of a range "r" 1104 of the swing of analog signal x[n] 102. Both SNR 1102 and r 1104 are expressed in decibels. Graph 1100 shows a value "DR" 1106 at the point of maximum SNR 1102 and a value "OL" 1108 at the maximum point of range r 1104 at which SNR degrades to 6 dB less than value DR 1106.

First order, single-stage, single-bit delta sigma modulator 802 is a basic design for a sigma delta modulator. Variations to this basic design have been introduced to improve these figures of merit.

FIG. 12 is a block diagram of a first-order, single-stage, two-bit delta sigma modulator 1200. Modulator 1200 comprises summing node $\Sigma_0$ 810, integrator 812, a two-bit quantizer 1202, and a two-bit DAC 1204. Summing node $\Sigma_0$ 810, integrator 812, and two-bit quantizer 1202 are connected, respectively, in series along signal path 808. Integrator 812 has a gain "$a_2$". Gain $a_2$ is determined empirically and is set to a value such that modulator 1200 functions with stability to process analog signal x[n] 102. Typically, gain $a_2$ has a value between zero and one. Two-bit DAC 1204 is connected in parallel with signal path 808 between node $N_0$ 806 and summing node $\Sigma_0$ 810. Two-bit quantizer 1202 and a two-bit DAC 1204 have a combined gain "$k_2$". Analog signal x[n] 102 is received by modulator 1200, at input 822, and converted into a two-bit quantized signal "$y_1[n]$" 1206, produced at node $N_0$ 806. Input 822 is an input and node $N_0$ 806 is an output of modulator 1200.

FIG. 13 is a graph 1300 of bias-free values of two-bit quantized signal $y_1[n]$ 1206, produced by two-bit quantizer 1202, as a function of bias-free values of analog signal x[n] 102. Two-bit quantizer 1202 divides analog signal x[n] 102 into four subranges. However, by using LOWER 902 and HIGHER 904, two-bit quantizer 1202 only needs to divide two-bit quantized signal $y_1[n]$ 1206 into three subranges. Therefore, two-bit quantizer 1202 defines a third value "HIGHER/3" 1302 at a point one-third of the range from HIGHER 904 to LOWER 902, and a fourth value "LOWER/3" 1304 at a point one-third of the range from LOWER 902 to HIGHER 904.

Because it is desirable that two-bit quantizer 1202 exhibit a similar error pattern to that shown at graph 400 for ADC 106, dashed line 1306 represents the ideal direct relationship between the values of analog signal x[n] 102 and two-bit quantized signal $y_1[n]$ 1206. Therefore, with analog signal x[n] 102 centered at a point measuring one-half of the range between LOW 108 and HIGH 110 (e.g., point Q2 308 from the example above), two-bit quantizer 1202 defines a subrange "E" 1308 that extends from LOW 108 to a point "LOW2/3" 1310 located two-thirds of the range from Q2 308 to LOW 108. A subrange "F" 1312 extends from LOW2/3 1310 to Q2 308. A subrange "G" 1314 extends from Q2 308 to a point "HIGH2/3" 1316 located two-thirds of the range from Q2 308 to HIGH 110. A subrange "H" 1318 extends from HIGH2/3 1316 to HIGH 110.

Two-bit quantizer 1202 assigns LOWER 902 to those values of analog signal x[n] 102 that are between LOW 108 and LOW2/3 1310, LOWER/3 1304 to those values of analog signal x[n] 102 that are between LOW2/3 1310 and Q2 308, HIGHER/3 1302 to those values of analog signal x[n] 102 that are between Q2 308 and HIGH2/3 1316, and HIGHER 904 to those values of analog signal x[n] 102 that are between HIGH2/3 1316 and HIGH 110.

Because two-bit quantizer 1202 divides analog signal x[n] 102 into four subranges, the measure of the LSB for two-bit quantizer 1202 is less than the measure of the LSB for quantizer 814. As graph 600 shows white noise to be directly proportional to the measure of the LSB, it follows that quantization noise n 1008 produced by modulator 1200 is less than quantization noise n 1008 produced by modulator 802. A similar analysis can be used to assess other multi-bit delta sigma modulators. As a rule of thumb, the SNR for a delta sigma ADC that incorporates a multi-bit delta sigma modulator improves by 6 dB for each additional bit of resolution beyond the second bit. However, the use of two-bit quantizer 1202 imposes tough demands on the linearity of two-bit DAC 1204, which must be nearly as linear as modulator 1202 as a whole. Multi-bit DACs with such precise linearity cannot be easily fabricated using Very Large Scale Integration technology.

The skilled artisan will appreciate that the foregoing explanation for two-bit quantizer 1202 also applies to quantizers that resolve analog signal x[n] 102 into a greater number of bits. In general, an n-bit quantizer divides analog signal x[n] 102 into $2^n$ subranges, but by using LOWER 902 and HIGHER 904, only divides an n-bit quantized signal $y_n[n]$ into $(2^n-1)$ subranges. For analog signal x[n] 102, of the $2^n$ subranges, a first subrange of the $2^n$ subranges is bounded by LOW 108 and a second subrange of the $2^n$ subranges is bounded by HIGH 110. Each of the first and second subranges measures $\{1/[2(2^n-1)]\}$ of the total range between LOW 108 and HIGH 110. The remaining $(2^n-2)$ subranges of the $2^n$ subranges are positioned between the first and second subranges. Each of the internal $(2^n-2)$ subranges measures $[1/(2^n-1)]$ of the total range between LOW 108 and HIGH 110. Note that n can be, but is not necessarily, an integer.

FIG. 14 is a block diagram of a second-order, single-stage, single-bit delta sigma modulator 1400. Modulator 1400 comprises first summing node $\Sigma_0$ 810, first integrator 812, a second summing node "$\Sigma_2$" 1402, a second integrator 1404, single-bit quantizer 814, and DAC 816. First summing node $\Sigma_0$ 810, first integrator 812, second summing node $\Sigma_2$ 1402, second integrator 1404, and quantizer 814 are connected, respectively, in series along signal path 808. First integrator 812 has a gain of "$a_3$". Second integrator 1404 has a gain of "$a_4$". Gains $a_3$ and $a_4$ are determined empirically and are set to values such that modulator 1400 functions with stability to process analog signal x[n] 102. Typically, gains $a_3$ and $a_4$ have values between zero and one. DAC 816 is connected in parallel with signal path 808 between node $N_0$ 806 and summing nodes $\Sigma_0$ 810 and $\Sigma_2$ 1402. Quantizer 814 and DAC 816 have a combined gain $k_1$. For analysis purposes, $k_1=1/a_3 a_4$. A higher order compensation gain element "$2a_3$" 1406 is connected between DAC 816 and second summing node $\Sigma_2$ 1402. Higher order compensation gain element $2a_3$ 1406 has a gain of "$2a_3$". Analog signal x[n] 102 is received by modulator 1400, at input 822, and converted into quantized signal y[n] 828, produced at node $N_0$ 806. Input 822 is an input and node $N_0$ 806 is an output of modulator 1400.

In a continuous time implementation, second integrator 1404 acts as a second highpass filter for quantization noise n 1008. Higher order compensation gain element $2a_3$ 1406 enables quantized signal y 828 to be expressed strictly as a second order function of frequency f as shown in Eq. (5):

$$y=[x+nf^2]/[f+1]^2. \qquad \text{Eq. (5)}$$

Thus, a delta sigma ADC that incorporates modulator 1400 can enjoy a better SNR than ADC 800. As a rule of thumb, the SNR for a delta sigma ADC that incorporates modulator 1400 improves by 15 dB for every doubling of its OSR. A similar analysis can be used to assess higher order delta sigma modulators. However, empirical studies have shown that, while delta sigma ADCs that incorporate higher order modulators are relatively insensitive to nonidealities in their functional components, the stability of these circuits rapidly deteriorates beyond the second order.

FIG. 15 is a block diagram of a second-order, two-stage, single-bit delta sigma modulator 1500. Modulator 1500 comprises a first modulator stage 1502, a coupling stage 1504, a second modulator stage 1506, and a noise cancellation logic stage 1508.

First modulator stage 1502 comprises first summing node $\Sigma_0$ 810, first integrator 812, first single-bit quantizer 814, and first DAC 816. First summing node $\Sigma_0$ 810, first integrator 812, and first quantizer 814 are connected, respectively, in series along signal path 808. First integrator 812 has gain $a_1$. Gain $a_1$ is determined empirically and is set to a value such that first modulator stage 1502 functions with stability to process analog signal x[n] 102. Typically, gain $a_1$ has a value between zero and one. First DAC 816 is connected in parallel with signal path 808 between node $N_0$ 806 and first summing node $\Sigma_0$ 810. First quantizer 814 and first DAC 816 have a combined gain $k_1$. For analysis purposes, $k_1=1/a_1$. Analog signal x[n] 102 is received by first modulator stage 1502, at input 822, and converted into a first modulated signal "$y_2[n]$" 1510, produced at node $N_0$ 806. Input 822 is an input and node $N_0$ 806 is an output of modulator stage 1502.

Coupling stage 1504 comprises a normalization gain element "$1/a_1$" 1512, a noise reduction gain element "$b_1$" 1514, a stability correction gain element "$c_1$" 1516, and a second summing node "$\Sigma_3$" 1518. Normalization gain element $1/a_1$ 1512 amplifies integrated signal v[n] 826 by a gain of "$1/a_1$", the inverse of gain $a_1$ of first integrator 812, to produce an amplified integrated signal "$1/a_1 v[n]$" 1520. This normalizes integrated signal v[n] 826. Noise reduction gain element $b_1$ 1514 amplifies analog feedback signal fbk[n] 830 by a gain of "$b_1$", to produce an amplified analog feedback signal "$b_1 fbk[n]$" 1522. (When a modulator stage has more than one integrator, each with a gain "$a_i$", often there is a relationship between gain $b_1$ and a ratio of the gain $a_i$ of the integrator immediately preceding the quantizer to the product of all gains $a_i$.) Second summing node $\Sigma_3$ 1518 subtracts amplified analog feedback signal $b_1 fbk[n]$ 1522 from amplified integrated signal $1/a_1 v[n]$ 1520 to yield a difference signal "d[n]" 1524. This reduces the amplitude distribution of quantization noise n[n] that is embedded within difference signal d[n] 1524. Stability correction gain element $c_1$ 1516 amplifies difference signal d[n] 1524 by a gain of "$c_1$" to produce a second analog signal "$x_2[n]$" 1526. Thus, integrated signal v[n] 826 and analog feedback signal fbk[n] 830 are received by coupling stage 1504 and converted into second analog signal $x_2[n]$ 1526, produced at a node "$N_1$" 1528.

In general, when coupling stage 1504 is preceded by a modulator stage with a single-bit quantizer, gain $c_1$ typically has a value between zero and one. Preferably, gain $c_1$ is set equal to a power of two. This simplifies the configuration of noise cancellation logic stage 1508. Always, gain $c_1$ is set so that the swing of an integrated signal (e.g., v[n] 826) produced by a second integrator 1530 of second modulator stage 1506 remains within the dynamic range of the operational amplifier used to implement second integrator 1530. Often there is an inverse relationship between gain $c_1$ and the product of gains $a_i$ of the integrators of the subsequent modulator stage.

Second modulator stage 1506 comprises a third summing node "$\Sigma_4$" 1532, second integrator 1530, a second single-bit quantizer 1534, and a second DAC 1536. Third summing node $\Sigma_4$ 1532, second integrator 1530, and second quantizer 1534 are connected, respectively, in series along signal path 808. Second integrator 1530 has a gain of "$a_5$". Gain $a_5$ is determined empirically and is set to a value such that second modulator stage 1506 functions with stability to process second analog signal $x_2[n]$ 1526. Typically, gain $a_5$ has a value between zero and one. Second DAC 1536 is connected in parallel with signal path 808 between a node "$N_2$" 1538 and third summing node $\Sigma_4$ 1532. Second quantizer 1534 and second DAC 1536 have a combined gain of "$k_3$". For analysis purposes, $k_3 = /a_5$. Second analog signal $x_2[n]$ 1526 is received by second modulator stage 1506, at node $N_2$ 1528, and converted into a second modulated signal "$y_3[n]$" 1540, produced at node $N_2$ 1538. Node $N_1$ 1528 is an input and node $N_2$ 1538 is an output of second modulator stage 1506.

Noise cancellation logic stage 1508 comprises a first delay element "$D_1$" 1542, a second delay element "$D_2$" 1544, a noise cancellation logic gain element "$(b_1-1)$" 1546, a stability normalization gain element "$1/c_1$" 1548, a fourth summing node "$\Sigma_5$" 1550, a fifth summing node "$\Sigma_6$" 1552, and a sixth summing node "$\Sigma_7$" 1554. First delay element $D_1$ 1542 receives first modulated signal $y_2[n]$ 1510 and delays it by a processing period to produce a delayed modulated signal "del[n]" 1556. Noise cancellation logic gain element $(b_1-1)$ 1546 receives delayed modulated signal del[n] 1556 and amplifies it by a gain of "$(b_1-1)$", one less than gain $b_1$ of noise reduction gain element $b_1$ 1514, to produce an amplified delayed modulated signal "$(b_1-1)$del[n]" 1558. This facilitates noise cancellation. Stability normalization gain element $1/c_1$ 1548 receives second modulated signal $y_3[n]$ 1540 and amplifies it by a gain "$1/c_1$", the inverse of gain $c_1$ of stability correction gain element $c_1$ 1516, to produce an amplified modulated signal "$y_3[n]/c_1$" 1560. This normalizes second modulated signal $y_3[n]$ 1540. Fourth summing node $\Sigma_5$ 1550 receives amplified delayed modulated signal $(b_1-1)$del[n] 1558 and adds it to amplified modulated signal $y_3[n]/c_1$ 1560 to produce a sum modulated signal "sum[n]" 1562. Second delay element $D_2$ 1544 receives sum modulated signal sum[n] 1562 and delays it by the processing period to produce a delayed sum modulated signal "delsum[n]" 1564. Fifth summing node $\Sigma_6$ 1552 receives delayed sum modulated signal delsum[n] 1564 and subtracts it from sum modulated signal sum[n] 1562 to produce a difference modulated signal "diff[n]" 1566. Sixth summing node $\Sigma_7$ 1554 receives delayed modulated signal del[n] 1556 and adds it to difference modulated signal diff[n] 1566 to produce quantized signal y[n] 828. Thus, first modulated signal $y_2[n]$ 1510 and second modulated signal $y_3[n]$ 1540 are received by noise cancellation logic stage 1508, respectively at nodes $N_0$ 806 and $N_2$ 1538, and converted into quantized signal y[n] 828, produced at a node "$N_3$" 1568. Nodes $N_0$ 806 and $N_2$ 1538 are inputs and node $N_3$ 1568 is an output of noise cancellation logic stage 1508.

The topology of multistage delta sigma modulators can be referenced by the order of each modulator stage. For example, modulator 1500 can be referred to as a 1—1 delta sigma modulator. Likewise, a delta sigma modulator that has a second order first stage, a first order second stage, and a first order third stage can be referred to as a 2-1-1 delta sigma modulator. Other multistage delta sigma modulators are similarly referenced by the order of each modulator stage.

Because the circuitry of a delta sigma ADC architecture includes both analog and digital components, the transfer functions of these components are often expressed in the discrete time "z" domain to account for the latency period between the time at which analog signal x[n] 102 is sampled and the time at which digital signal z[n] 104 is produced. Multistage delta sigma modulators, such as modulator 1500, particularly lend themselves to analysis in the discrete time domain.

FIG. 16 is a block diagram of second-order, two-stage, single-bit delta sigma modulator 1500 recast as a discrete time domain model 1600. In model 1600, first integrator 812 is replaced by a first discrete time integrator 1602, and first single-bit quantizer 814 is replaced by a first gain element 1604 connected in series with a second summing node "$\Sigma_8$" 1606. (First summing node $\Sigma_0$ 810 remains a component of model 1600.) First discrete time integrator 1602 has gain $a_1$. First gain element 1604 has gain $k_1$. First DAC 816 is replaced by a first parallel connection "$L_1$" 1608 between node $N_0$ 806 and first summing node $\Sigma_0$ 810. Likewise, second integrator 1530 is replaced by a second discrete time integrator 1610, and second single-bit quantizer 1534 is replaced by a second gain element 1612 connected in series with a fourth summing node "$\Sigma_9$" 1614. (Third summing node $\Sigma_4$ 1532 remains a component of model 1600.) Second discrete time integrator 1610 has gain $a_5$. Second gain element 1612 has gain $k_3$. Second DAC 1536 is replaced by a second parallel connection "$L_2$" 1616 between node $N_2$ 1538 and third summing node $\Sigma_4$ 1532. Each of first and second discrete time integrators 1602, 1610 has a transfer function of "$z^{-1}/(1-z^{-1})$". Coupling stage 1504 remains a component of model 1600. Noise cancellation logic gain element ($b_1-1$) 1546, stability normalization gain element $1/c_1$ 1548, summing node $\Sigma_5$ 1550, and summing node $\Sigma_7$ 1554 remain components of model 1600. First delay element $D_1$ 1542 is replace by a digital delay element 1618. Digital delay element 1618 has a transfer function of "$z^{-1}$". Second delay element $D_2$ 1544 and summing node $\Sigma_6$ 1552 are replaced by a digital differentiator 1620. Digital differentiator 1620 has a transfer function of "$(1-z^{-1})$".

In model 1600, a first quantization noise "$n_1[n]$" 1622 is added at second summing node $\Sigma_8$ 1606, and a second quantization noise "$n_2[n]$" 1624 is added at fourth summing node $\Sigma_9$ 1614.

Recalling that gain $a_1$ is set equal to the inverse of gain $k_1$, first modulated signal $y_2[n]$ 1510 can be expressed as a function of analog signal $x[n]$ 102, transfer function, $z^{-1}/(1-z^{-1})$, of first discrete time integrator 1602, gain $a_1$ of first discrete time integrator 1602, gain $k_1$ of first gain element 1604, and first quantization noise $n_1[n]$ 1622 as shown in Eq. (6):

$$y_2[n]=x[n]z^{-1}+n_1[n](1-z^{-1}). \quad \text{Eq. (6)}$$

Second analog signal $x_2[n]$ 1526 can be expressed as a function of first modulated signal $y_2[n]$ 1510, first quantization noise $n_1[n]$ 1622, normalization gain element $1/a_1$ 1512, noise cancellation setup gain element $b_1$ 1514, and stability correction gain element $c_1$ 1516 as shown in Eq. (7):

$$x_2[n]=c_1(1-b_1)y_2[n]-c_1 n_1[n]. \quad \text{Eq. (7)}$$

Recalling that $a_5$ is set equal to the inverse of $k_3$, second modulated signal $y_3[n]$ 1540 can be expressed as a function of second analog signal $x_2[n]$ 1526, transfer function, $z^{-1}/(1-z^{-1})$, of second discrete time integrator 1610, gain $a_5$ of second discrete time integrator 1610, gain $k_3$ of second gain element 1612, and second quantization noise $n_2[n]$ 1624 as shown in Eq. (8):

$$y_3[n]=x_2[n]z^{-1}+n_2[n](1-z^{-1}). \quad \text{Eq. (8)}$$

Using Eq. (7), Eq. (8) can be simplified as shown in Eq. (9):

$$y_3[n]=c_1(1-b_1)y_2[n]z^{-1}-c_1 n_1[n]z^{-1}+n_2[n](1-z^{-1}).$$

Quantized signal $y[n]$ 828 can be expressed as a function of first modulated signal $y_2[n]$ 1510, second modulated signal $y_3[n]$ 1540, transfer function, $z^{-1}$, of digital delay element 1618, transfer function, $1-z^{-1}$, of digital differentiator 1620, noise cancellation logic gain element $(b_1-1)$ 1546, and stability normalization gain element $1/c_1$ 1548 as shown in Eq. (10):

$$y[n]=y_2[n]z^{-1}+[(b_1-1)y_2[n]z^{-1}+y_3[n]/c_1][1-z^{-1}]. \quad \text{Eq. (10)}$$

Using Eq. (9), Eq. (10) can be simplified as shown in Eq. (11):

$$y[n]=y_2[n]z^{-1}-n_1[n]z^{-1}(1-z^{-1})+n_2[n]/c_1(1-z^{-1})^2. \quad \text{Eq. (11)}$$

Using Eq. (6), Eq. (11) can be simplified as shown in Eq. (12):

$$y[n]=x[n]z^{-2}+n_2[n]/c_1(1-z^{-1})^2. \quad \text{Eq. (12)}$$

Eq. (12) shows that modulator 1500 acts to shape the quantization noise $n[n]$ that is embedded within quantized signal $y[n]$ 828. First quantization noise $n_1[n]$ 1622 from first modulator stage 1502 is canceled and second quantization noise $n_2[n]$ 1624 from second modulator stage 1506 is desirably reduced to a second order effect. However, because gain c1 of stability correction gain element $c_1$ 1516 typically has a value between zero and one, modulator 1500 also undesirably amplifies second quantization noise $n_2[n]$ 1624.

A similar analysis can be used to assess other multistage delta sigma modulators. Delta sigma ADCs that incorporate multiple stages of low order modulators can provide a stable means for realizing the noise-shaping capabilities of high order, single-stage modulators. However, empirical studies have shown that multistage topologies have a more pronounced degree of sensitivity for nonidealities within their functional components.

More complex delta sigma modulator topologies can be designed by combining and/or expanding upon the principles explained above with regards to modulators 802, 1200, 1400, and 1500. For a given application, a more complex topology would enable a designer to optimize desirable features while minimizing undesirable ones.

A systematic study of delta sigma modulator topologies is presented in Marques, A. et al., *IEEE Transactions on Circuits and Systems II: Analog and Digital Signal Processing* 45:1232–1241 (September 1998), which is incorporated herein by reference. Marques et al. examines the relationships among the gain scaling coefficients of integrators (i.e., $a_1$, $a_2$, etc.) and coupling stages gain elements (i.e., $b_1$, $c_1$, etc.) of various multistage delta sigma modulator topologies to determine what values should be assigned to each of these gain scaling coefficients to maximize the DRs. Marques et al. teaches specific values for each of these gain scaling coefficients. An unfortunate consequence of the specific values taught by Marques et al. is that they cause the quantization errors $e[n]$ embedded within quantized signals $y[n]$ 828 to be amplified. This limits the SNRs of the topologies. What are needed are gain scaling coefficients that can increase the SNRs of the various multistage delta sigma modulator topologies without reducing their DRs.

BRIEF SUMMARY OF THE INVENTION

The present invention relates to gain scaling of multistage, multi-bit delta sigma modulators for higher signal-to-noise ratios. In a multistage delta sigma modulator having a modulator stage with an integrator, a multi-bit quantizer, and a multi-bit DAC, the multi-bit quantizer is configured to cause a feedback signal produced by the multi-bit DAC to have a first gain, with respect to an integrated signal received by the multi-bit quantizer, set greater than one. A second gain, of the integrator, is reduced so that an overall gain of the modulator stage remains equal to one. A third gain, of a stability correction gain element connected to an input of the modulator stage, is increased so that a swing of the integrated signal produced by the integrator remains within a dynamic range of an operational amplifier used to implement the integrator, and the multistage delta sigma modulator can realize the higher SNR. Preferably, but not by way of limitation, the third gain is set equal to a power of two as this enables a noise cancellation logic stage of the delta sigma modulator to have a traditional configuration.

The present invention comprises a multistage delta sigma modulator having a first modulator stage, a coupling stage, a second modulator stage, and a noise cancellation logic stage. The first modulator stage has an input capable of receiving an analog signal. In an embodiment, the first modulator stage has a plurality of integrators. Preferably, the first modulator stage has a single-bit quantizer. The coupling stage is connected to the first modulator stage and has a stability correction gain element. The coupling stage is configured to produce a second analog signal that has a range. In an embodiment, the first modulator stage comprises a plurality of modulator stages and the coupling stage comprises a plurality of coupling stages. The second modulator stage is connected to the coupling stage and has an integrator, an n-bit quantizer, and an n-bit digital-to-analog converter. The noise cancellation logic stage is connected to the first modulator stage and the second modulator stage and has an output.

The n-bit quantizer is configured to produce an n-bit quantized signal. The n-bit quantizer divides the range into $2^n$ subranges. A first subrange of the $2^n$ subranges is bounded by a lowest value of the range. A second subrange of the $2^n$ subranges is bounded by a highest value of the range. At least one remaining subrange of the $2^n$ subranges is positioned between the first and the second subranges. The first and the second subranges each measure greater than $\{1/[2(2^n-1)]\}$ of the range. Each of the at least one remaining subrange measures less than $[1/(2^n 1)]$ of the range. In an embodiment, each of the at least one remaining subrange measures $\{1/[2(2^n-1)]\}$ of the range. Note that n can be, but is not necessarily, an integer.

Preferably, the n-bit quantizer is capable of causing a feedback analog signal, produced by the n-bit digital-to-analog convertor, to have a first gain that is greater than one with respect to an integrated signal received by the n-bit quantize. Preferably, the integrator has a second gain that causes an overall gain of the second modulator stage to be equal to one. In an embodiment, the integrator comprises a plurality of integrators and the second gain comprises a plurality of second gains. Preferably, the stability correction gain element has a third gain determined so that a swing of the integrated signal remains within a dynamic range of the integrator. In an embodiment, the third gain is a highest gain so that the swing of said integrated signal remains within the dynamic range of the integrator. In another embodiment, the third gain is determined to simplify implementation of the noise cancellation logic stage. Preferably, the third gain is a power of two.

The present invention also comprises a method of quantizing an analog signal with a multistage delta sigma modulator. The analog signal is received at a first modulator stage. The analog signal is processed at the first modulator stage to produce a first quantized signal. A second analog signal is produced from the analog signal. The second analog signal has a range. The second analog signal is processed at a second modulator stage to produce a second quantized signal. The second modulator stage has an n-bit quantizer configured to divide the range into $2^n$ subranges. A first subrange of the $2^n$ subranges is bounded by a lowest value of the range. A second subrange of the $2^n$ subranges is bounded by a highest value of the range. At least one remaining subrange of the $2^n$ subranges is positioned between the first and the second subranges. Each of the at least one remaining subrange measures less than $[1/(2^n-1)]$ of the range. The first and the second quantized signals are combined.

In an embodiment, the method can further comprise setting a gain of a stability correction gain element of a coupling stage connected between the first modulator stage and the second modulator stage so that a swing of said second analog signal remains within a dynamic range of the second modulator stage. Preferably, the gain is a highest gain so that the swing of said second analog signal remains within the dynamic range of the second modulator stage.

In another embodiment, the method can further comprise setting a gain of a stability correction gain element of a coupling stage connected between the first modulator stage and the second modulator stage to simplify implementation of a noise cancellation logic stage. Preferably, the gain is a power of two.

In yet another embodiment, the method can further comprise setting a gain of an integrator of the second modulator stage so that the second modulator stage is stable. Preferably, the gain is a lowest gain so that the second modulator stage is stable.

In still another embodiment, the method can further comprise setting a gain of an integrator of the second modulator stage so that an overall gain of the second modulator stage is one.

The present invention also comprises a method of realizing a higher signal-to-noise ratio in a multistage, n-bit delta sigma modulator. An n-bit quantizer of a downstream modulator stage is configured to produce an n-bit quantized signal from an analog signal having a range. The n-bit quantizer divides the range into $2^n$ subranges. A first subrange of the $2^n$ subranges is bounded by a lowest value of the range. A second subrange of the $2^n$ subranges is bounded by a highest value of the range. At least one remaining subrange of the $2^n$ subranges is positioned between the first and the second subranges. Each of the at least one remaining subrange measures less than $[1/(2^n-1)]$ of the range. A first gain of an integrator of the downstream modulator stage is set so that the downstream modulator stage is stable. Preferably, the first gain is a lowest gain so that the downstream modulator stage is stable. A second gain of a stability correction gain element of a coupling stage connected to the downstream modulator stage is set so that a swing of the analog signal remains within a dynamic range of the downstream modulator stage. Preferably, the second gain is a highest gain so that the swing of the analog signal remains within the dynamic range of the downstream modulator stage. Optionally, the second gain simplifies implementation of a noise cancellation logic stage.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 23 shows a flow chart of a method 2300 of realizing a higher signal-to-noise ratio in a multistage, n-bit delta sigma modulator.

The preferred embodiments of the invention are described with reference to the figures where like reference numbers indicate identical or functionally similar elements. Also in the figures, the left-most digit(s) of each reference number identify the figure in which the reference number is first used.

DETAILED DESCRIPTION OF THE INVENTION

Figure 17:
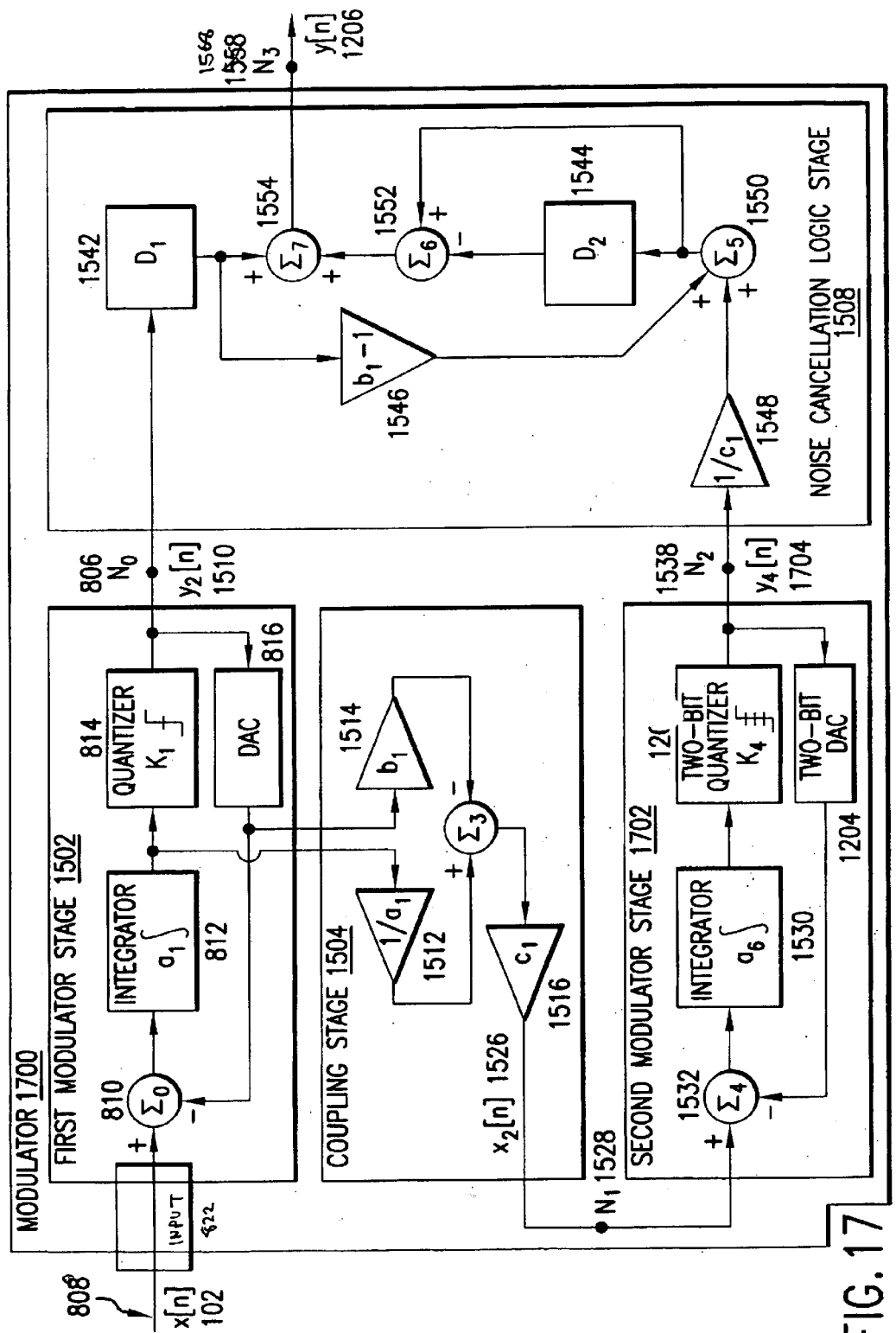
FIG. 17 is a block diagram of a second-order, two-stage, two-bit delta sigma modulator 1700 that can embody the present invention.

The present invention relates to gain scaling of multistage, multi-bit delta sigma modulators for higher signal-to-noise ratios. FIG. 17 is a block diagram of a second-order, two-stage, two-bit delta sigma modulator 1700 that can embody the present invention. Modulator 1700 comprises first modulator stage 1502, coupling stage 1504, a second modulator stage 1702, and noise cancellation logic stage 1508. Analog signal x[n] 102 is received by modulator 1700, at input 822, and converted into two-bit quantized signal $y_1[n]$ 1206, produced at node $N_3$ 1568. Input 822 is an input and node $N_3$ 1568 is an output of modulator 1700.

Second modulator stage 1702 comprises third summing node $\Sigma_4$ 1532, second integrator 1530, two-bit quantizer 1202, and two-bit DAC 1204. Third summing node $\Sigma_4$ 1532, second integrator 1530, and two-bit quantizer 1202 are connected, respectively, in series along signal path 808. Second integrator 1530 has a gain of "$a_6$". Gain $a_6$ is determined empirically and is set to a value such that second modulator stage 1702 functions with stability to process second analog signal $x_2[n]$ 1526. Typically, gain $a_6$ has a value between zero and one. Two-bit DAC 1204 is connected in parallel with signal path 808 between node $N_2$ 1538 and third summing node $\Sigma_4$ 1532. Two-bit quantizer 1202 and a two-bit DAC 1204 have a combined gain of "$k_4$". Second analog signal $x_2[n]$ 1526 is received by second modulator stage 1702, at node $N_1$ 1528, and converted into a two-bit modulated signal "$y_4[n]$" 1704, produced at node $N_2$ 1538. Node $N_1$ 1528 is an input and node $N_2$ 1538 is an output of second modulator stage 1702.

Similar to the expression shown in Eq. (12) for quantized signal y[n] 828 produced by modulator 1500, two-bit quantized signal $y_1[n]$ 1206 produced by modulator 1700 can be expressed as shown in Eq. (13):

$$y_1[n]=x[n]z^{-2}+n_2[n]/c_1(1-z^{-1})^2. \qquad \text{Eq. (13)}$$

However, unlike second single-bit quantizer 1534 of second modulator stage 1506, which divides second analog signal $x_2[n]$ 1526 into two subranges, two-bit quantizer 1202 divides second analog signal $x_2[n]$ 1526 into four subranges as shown at graph 1300. Because two-bit quantizer 1202 produces quantized values that are in between LOWER 902 and HIGHER 904, combined gain $k_4$ can be determined as a function of the slope of dashed line 1306.

Traditionally, for analysis purposes, combined gain $k_4$ is assumed to be equal to the inverse of gain $a_6$ so that second quantization noise $n_2[n]$ 1624 can be modeled as white noise and an overall gain of modulator 1700 can be set equal to one. However, rather than assigning an assumed value to combined gain $k_4$ for analysis purposes, the present invention exploits the idea that, for modulator stage 1702, combined gain $k_4$ can be determined. Because combined gain $k_4$ can be determined, it can be set to a desirable value.

Figure 1:
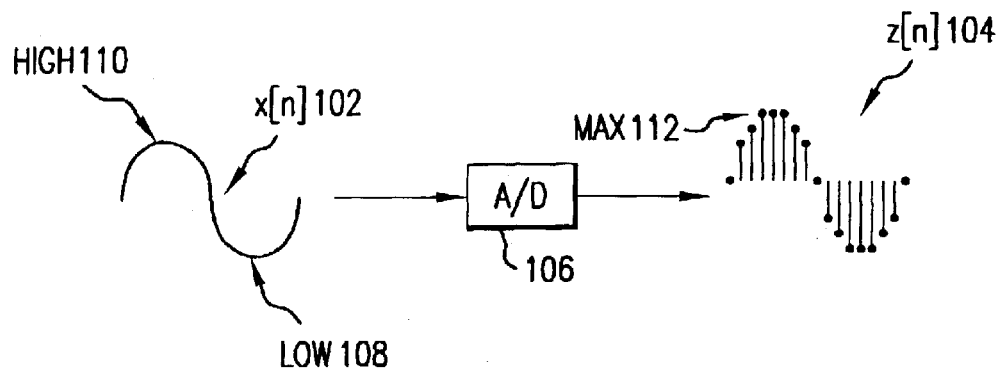
FIG. 1 shows a process for converting an analog signal "x[n]" 102 to a digital signal "z[n]" 104 using an exemplary ADC 106.
Figure 2:
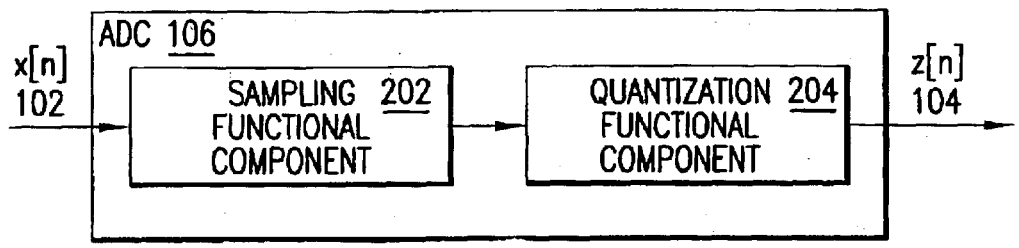
FIG. 2 is a block diagram of ADC 106.
Figure 3:
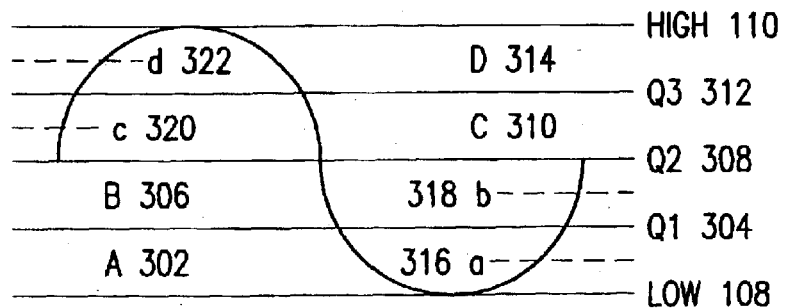
FIG. 3 illustrates the process within quantization functional component 204.
Figure 4:
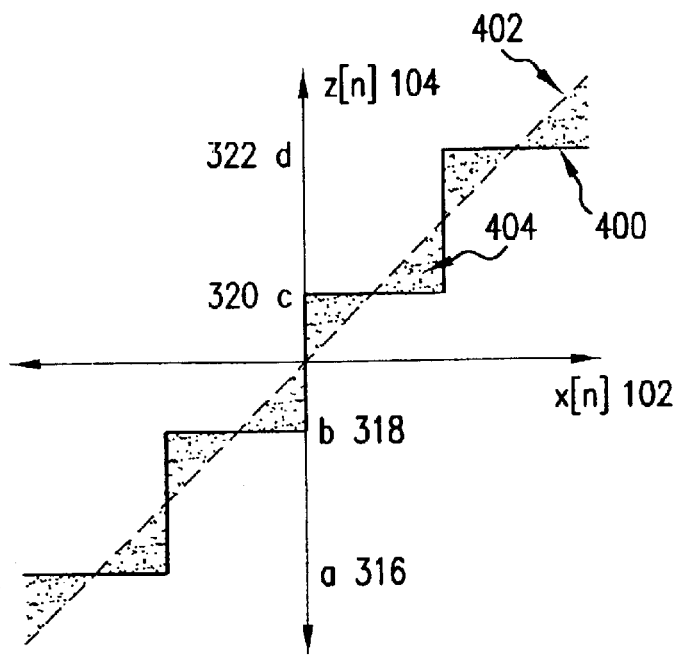
FIG. 4 is a graph 400 of bias-free values of digital signal z[n] 104 as a function of bias-free values of analog signal x[n] 102.
Figure 5:
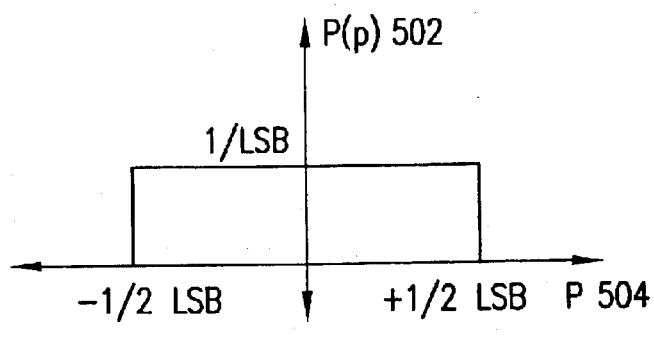
FIG. 5 is a graph 500 of a probability density "P(p)" 502 of a subrange of digital signal z[n] 104 as a function of the parameter "p" 504 of analog signal x[n] 102.
Figure 6:
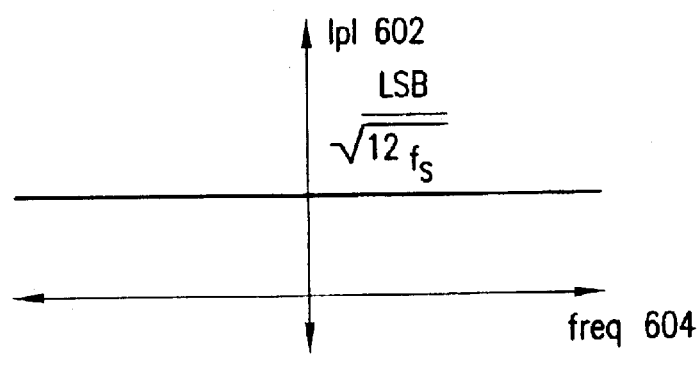
FIG. 6 is a graph 600 of probability density P(p) 502 in the frequency domain.
Figure 7:
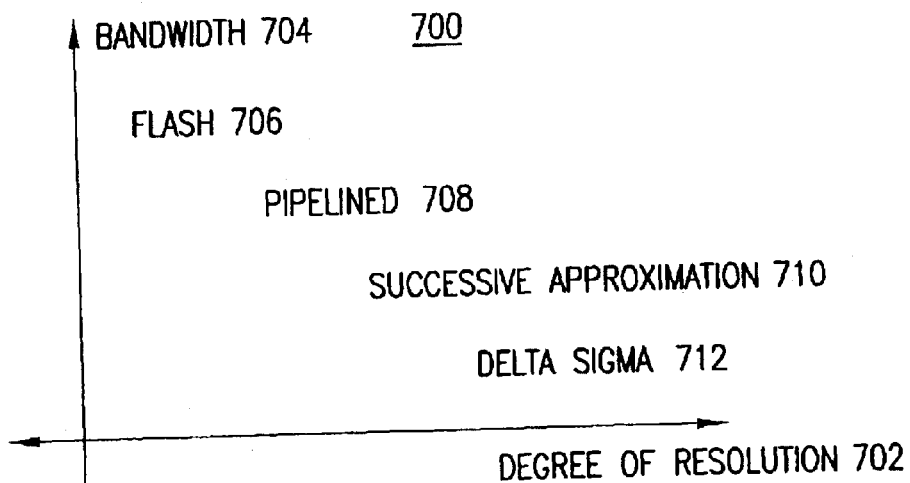
FIG. 7 is a graph 700 that shows the tradeoff between bandwidth and degree of resolution for the various ADC architectures.
Figure 9:
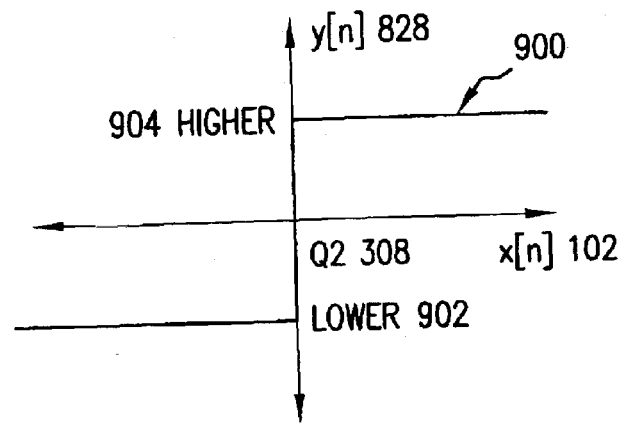
FIG. 9 is a graph 900 of bias-free values of quantized signal y[n] 828, produced by single-bit quantizer 814, as a function of bias-free values of analog signal x[n] 102.
Figure 10:
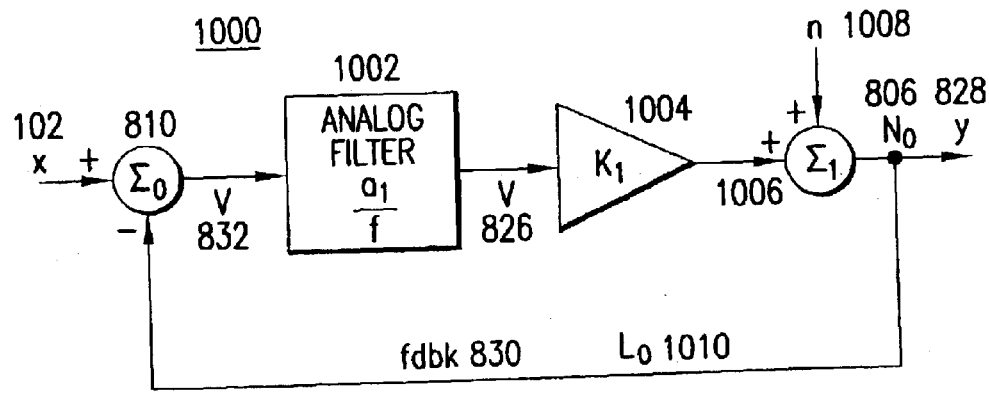
FIG. 10 is a block diagram of first-order, single-stage, single-bit delta sigma modulator 802 recast as a frequency domain model 1000 for a continuous time implementation.
Figure 8:
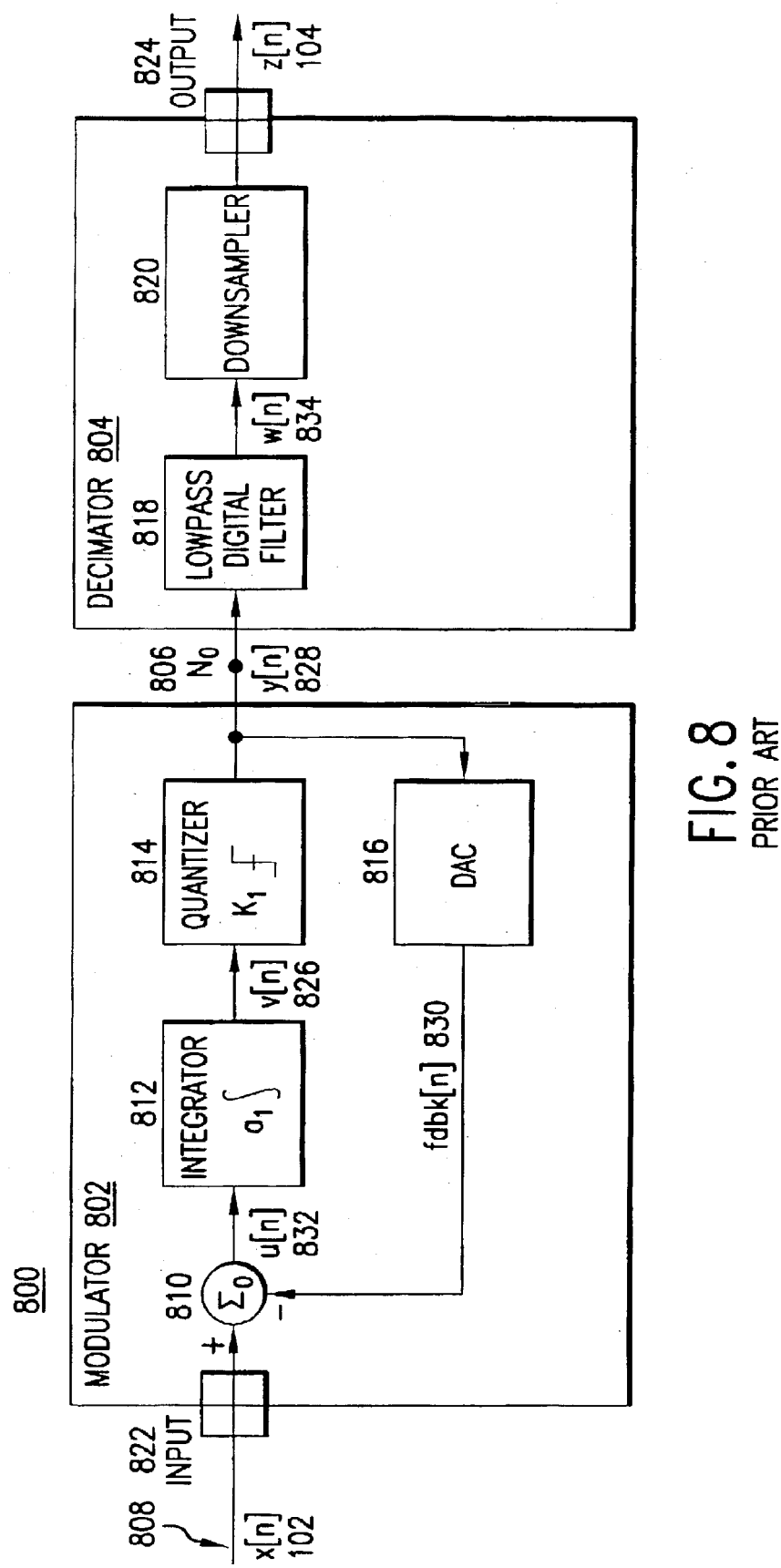
FIG. 8 is a block diagram of a first-order, single-stage, single-bit delta sigma ADC 800.
Figure 11:
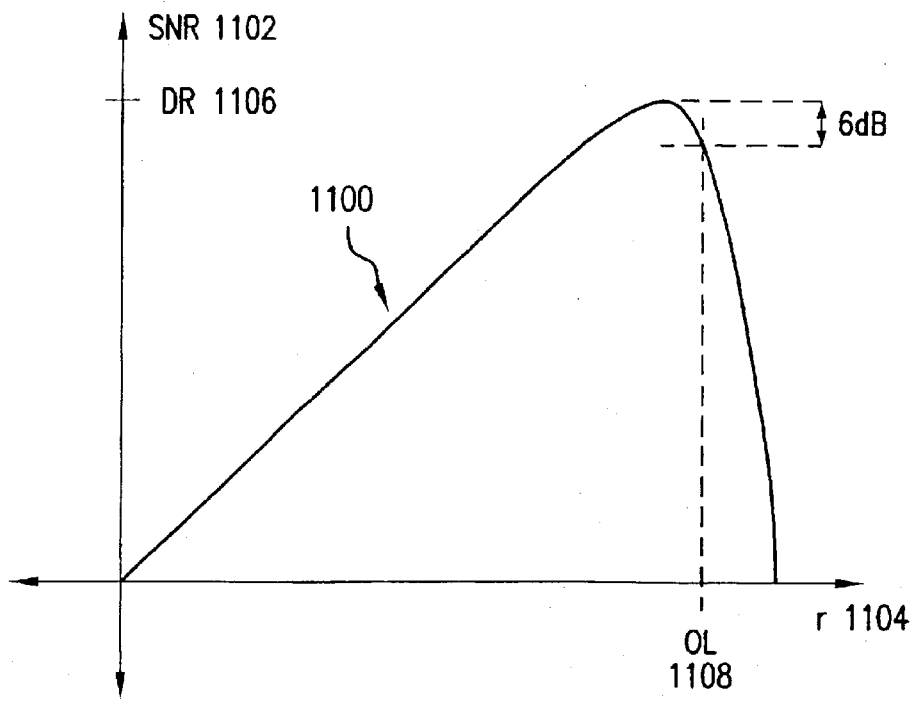
FIG. 11 is a graph 1100 of the "SNR" 1102 as a function of a range "r" 1104 of the swing of analog signal x[n] 102.
Figure 12:
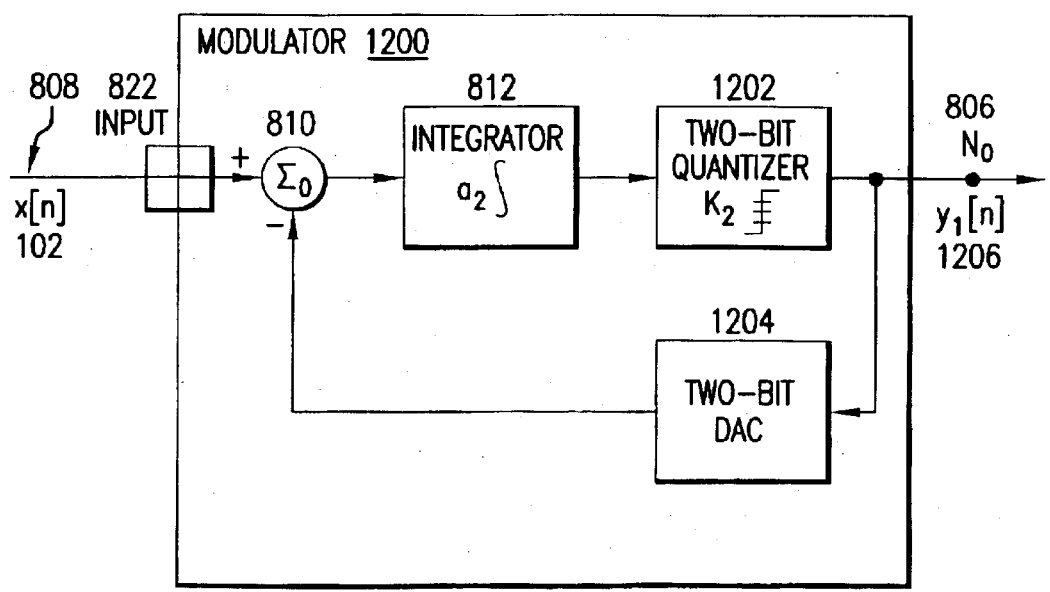
FIG. 12 is a block diagram of a first-order, single-stage, two-bit delta sigma modulator 1200.
Figure 13:
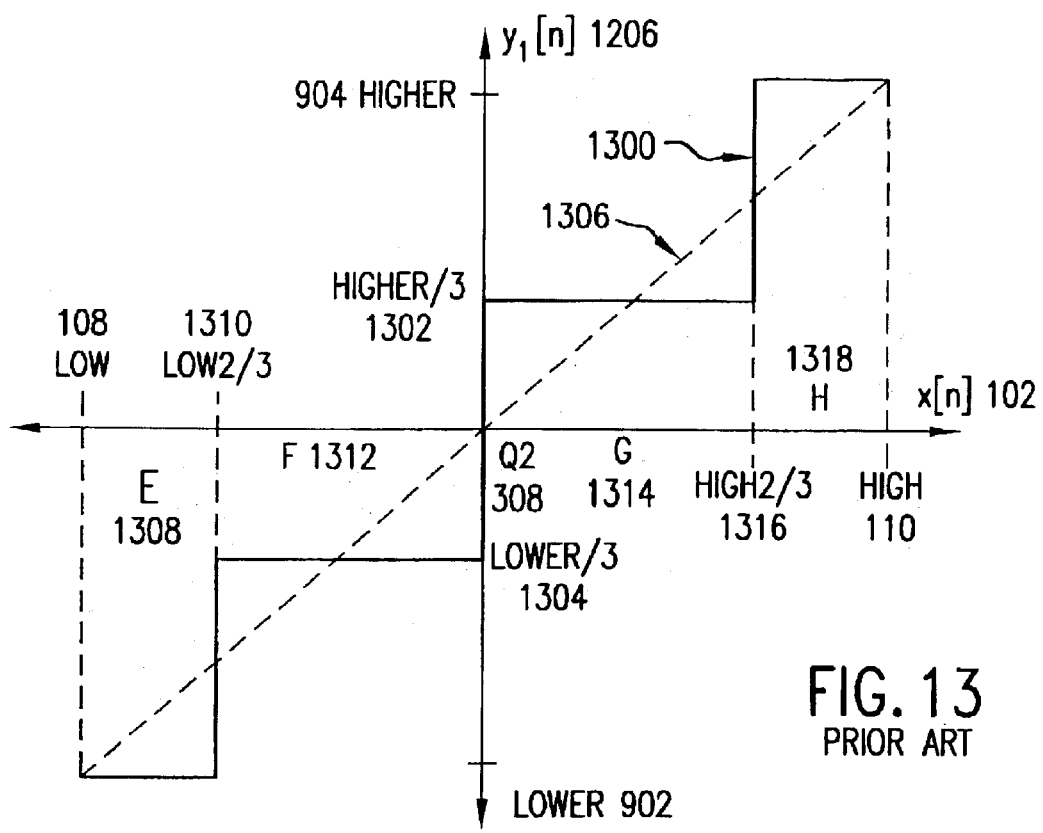
FIG. 13 is a graph 1300 of bias-free values of two-bit quantized signal $y_1[n]$ 1206, produced by two-bit quantizer 1202, as a function of bias-free values of analog signal x[n] 102.
Figure 18:
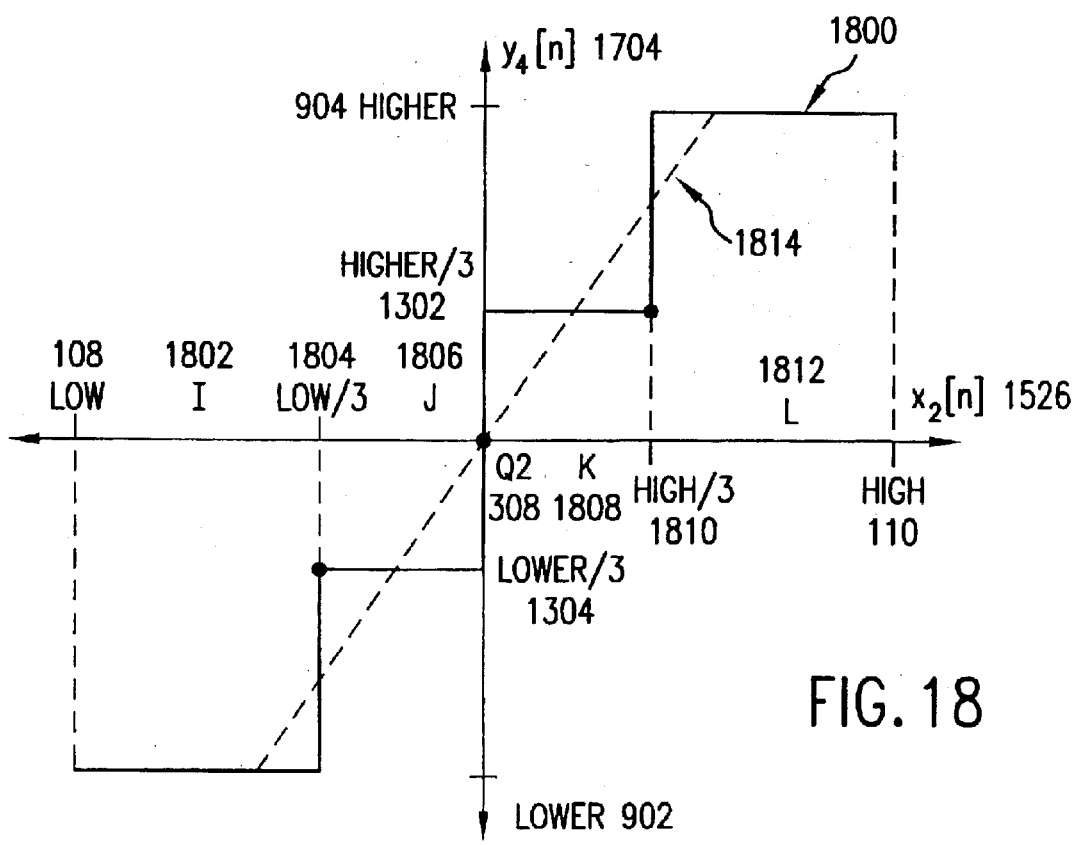
FIG. 18 is a graph 1800 of bias-free values of second two-bit modulated signal $y_4[n]$ 1704, produced by a two-bit quantizer, as a function of bias-free values of second analog signal $x_2[n]$ 1526.
Figure 14:
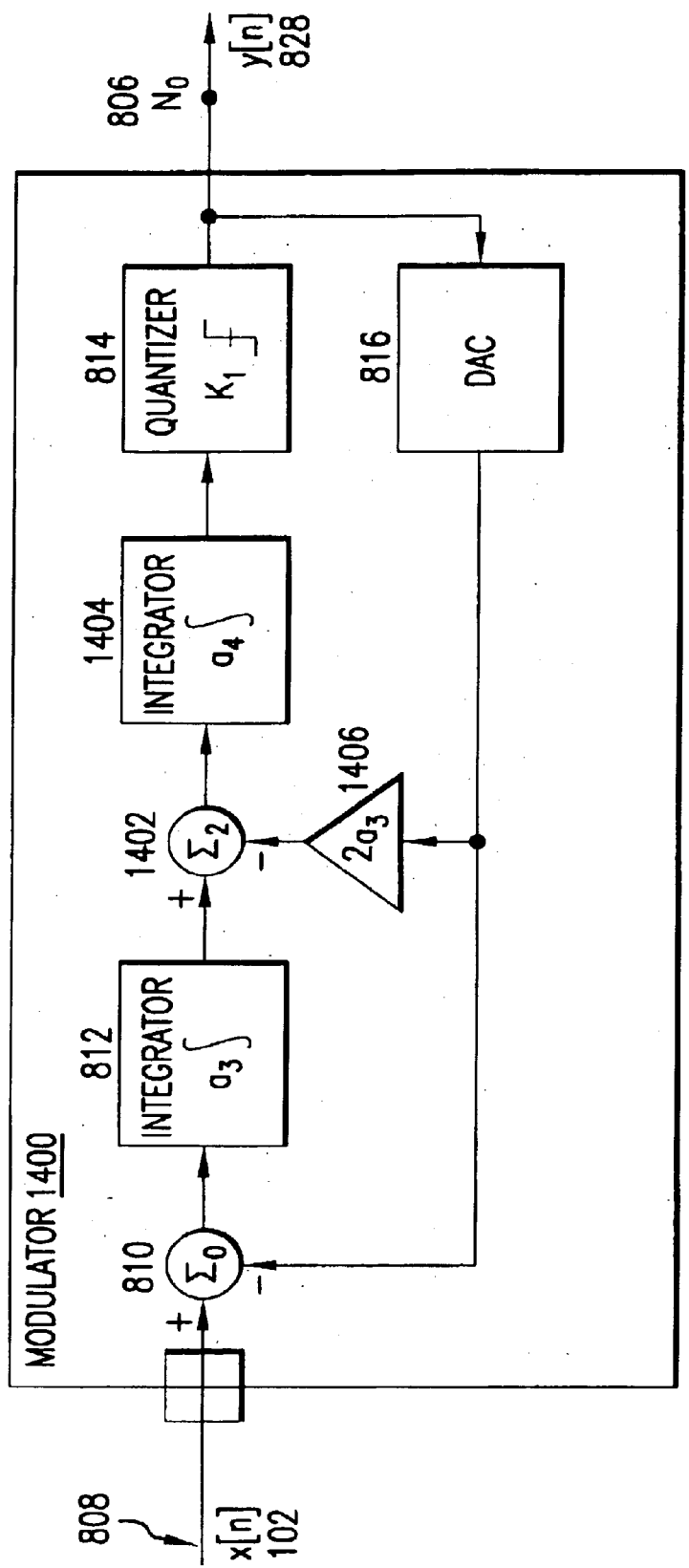
FIG. 14 is a block diagram of a second-order, single-stage, single-bit delta sigma modulator 1400.
Figure 15:
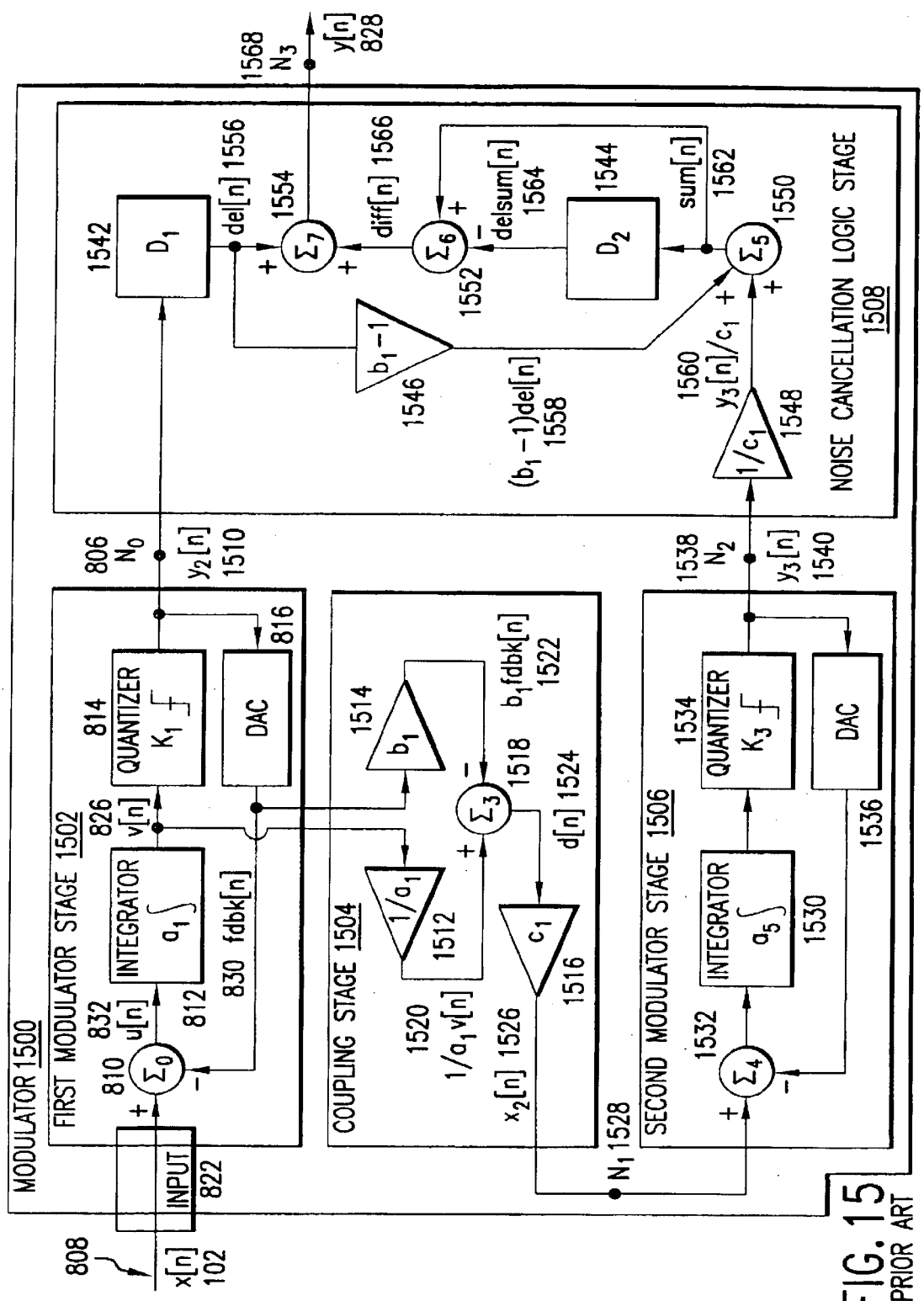
FIG. 15 is a block diagram of a second-order, two-stage, single-bit delta sigma modulator 1500.
Figure 16:
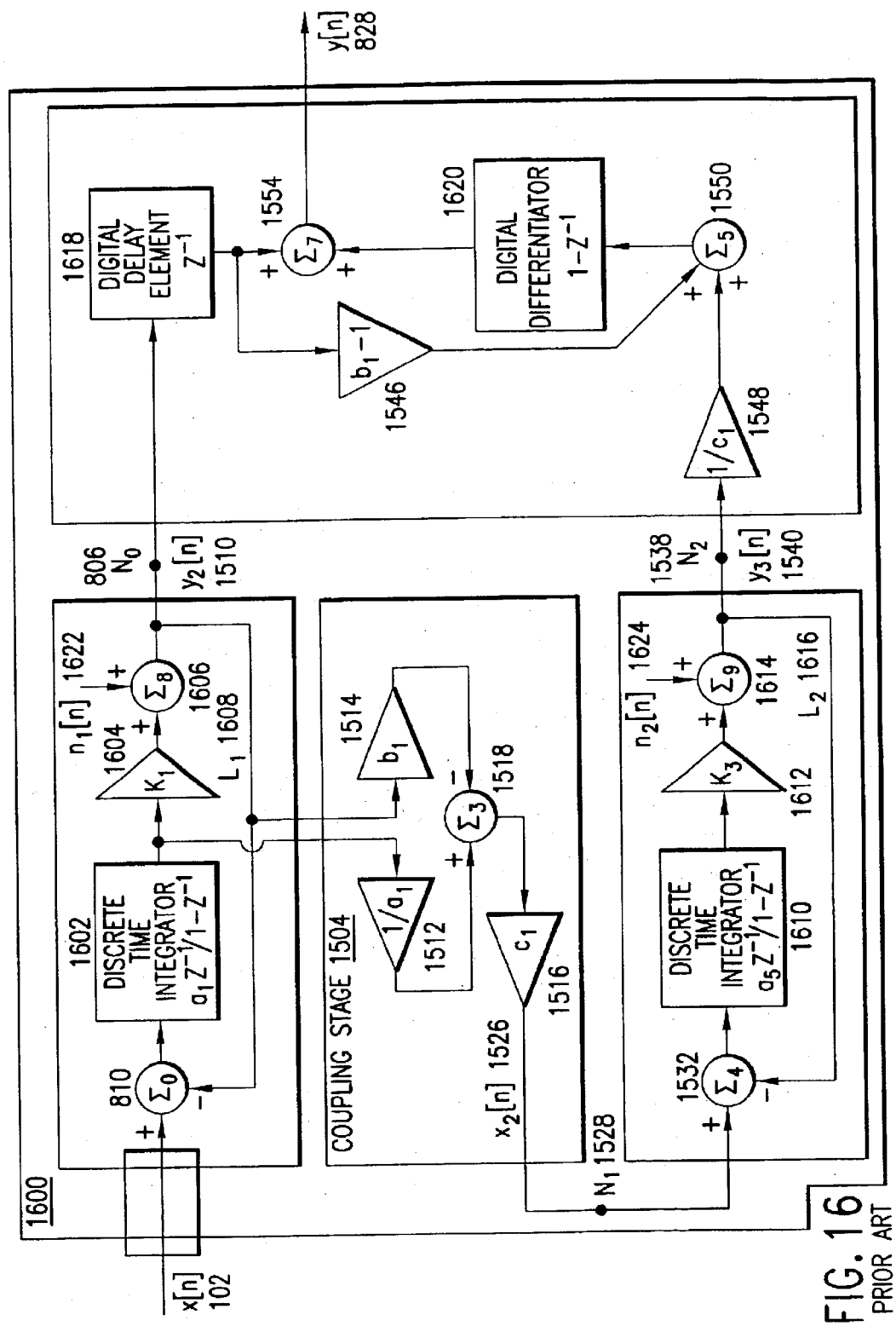
FIG. 16 is a block diagram of second-order, two-stage, single-bit delta sigma modulator 1500 recast as a discrete time domain model 1600.

FIG. 18 is a graph 1800 of bias-free values of second two-bit modulated signal $y_4[n]$ 1704, produced by a two-bit quantizer of the present invention, as a function of bias-free values of second analog signal $x_2[n]$ 1526. As with two-bit quantizer 1202, the two-bit quantizer of the present invention divides second analog signal $x_2[n]$ 1526 into four subranges. Likewise, by using LOWER 902 and HIGHER 904, the two-bit quantizer of the present invention only needs to divide second two-bit modulated signal $y_4[n]$ 1704 into three subranges. Therefore, as with two-bit quantizer 1202, the two-bit quantizer of the present invention defines third value HIGHER/3 1302 at the point one-third of the range from HIGHER 904 to LOWER 902, and fourth value LOWER/3 1304 at the point one-third of the range from LOWER 902 to HIGHER 904.

However, to set combined gain $k_4$ to a desirable value, the two-bit quantizer defines subranges for second analog signal $x_2[n]$ 1526 different from those defined by two-bit quantizer 1202. With second analog signal $x_2[n]$ 1526 centered at a point measuring one-half of the range between LOW 108 and HIGH 110 (e.g., point Q2 308 from the example above), the two-bit quantizer of the present invention defines a subrange "I" 1802 that extends from LOW 108 to a point "LOW/3" 1804 located one-third of the range from Q2 308 to LOW 108. A subrange "J" 1806 extends from LOW/3 1804 to Q2 308. A subrange "K" 1808 extends from Q2 308 to a point "HIGH/3" 1810 located one-third of the range from Q2 308 to HIGH 110. A subrange "L" 1812 extends from HIGH/3 1810 to HIGH 110.

The two-bit quantizer of the present invention assigns LOWER 902 to those values of second analog signal $x_2[n]$ 1526 that are between LOW 108 and LOW/3 1804, LOWER/3 1304 to those values of second analog signal $x_2[n]$ 1526 that are between LOW/3 1804 and Q2 308, HIGHER/3 1302 to those values of second analog signal $x_2[n]$ 1526 that are between Q2 308 and HIGH/3 1810, and HIGHER 904 to those values of second analog signal $x_2[n]$ 1526 that are between HIGH/3 1810 and HIGH 110.

In comparison with dashed line 1306 at graph 1300, the slope of a dashed line 1814 at graph 1800 is twice as steep. Therefore, if two-bit quantizer 1202 of modulator 1700 is replaced by the two-bit quantizer of the present invention characterized at graph 1800, then combined gain $k_4$ will be doubled. This requires gain $a_6$ to be halved so that the overall gain of modulator 1700 remains equal to one. Recalling that gain $c_1$ of stability correction gain element 1516 was originally set so that the swing of an integrated signal (e.g., v[n] 826) produced by second integrator 1530 remained within the dynamic range of the operational amplifier used to implement second integrator 1530, reducing gain $a_6$ allows gain $c_1$ to be increased to the extent that the swing of the integrated signal produced by second integrator 1530 continues to remain within the dynamic range of the operational amplifier used to implement second integrator 1530. Via Eq. (13), an increase in gain $c_1$ decreases the quantization noise n[n] that is embedded within two-bit quantized signal $y_1[n]$ 1206. Thus, modulator 1700 realizes a higher SNR without a reduction to its DR.

The skilled artisan will appreciate that any multi-bit quantizer can be configured in the manner of the present invention. Therefore, the present invention is not limited to the two-bit quantizer characterized at graph 1800. Likewise, the present invention is not limited to the specific relationship shown at graph 1800. In general, for an n-bit quantizer of the present invention that divides second analog signal $x_2[n]$ 1526 into $2^n$ subranges, a first subrange of the $2^n$ subranges is bounded by LOW 108 and a second subrange of the $2^n$ subranges is bounded by HIGH 110. Each of the first and the second subranges measures greater than $\{1/[2(2^n-1)]\}$ of the total range between LOW 108 and HIGH 110. The remaining $(2^n-2)$ subranges of the $2^n$ subranges are positioned between the first and second subranges. Each of the internal $(2^n-2)$ subranges measures less than $[1/(2^n-1)]$ of the total range between LOW 108 and HIGH 110. In an embodiment, each of the internal $(2^n-2)$ subranges measures $\{1/[2(2^n-1)]\}$ of the total range between LOW 108 and HIGH 110, while the first and second subranges combined measure the difference between the total range and the sum of the measures of the internal $(2^n-2)$ subranges. Note that n can be, but is not necessarily, an integer.

The present invention can employ other relationships to establish other desired values for combined gain $k_4$. Preferably, but not by way of limitation, gain $c_1$ is set equal to a power of two. Having gain $c_1$ is set equal to a power of two enables noise cancellation logic stage 1508 to remain as configured. The present invention extends to all multistage, multi-bit delta sigma modulator topologies in which a modulator stage having a multi-bit quantizer configured in the manner of the present invention is preceded by another modulator stage. These other topologies can employ noise cancellation logic stages configured in a manner different from that of noise cancellation logic stage 1508. For these other topologies, the gain of a stability correction gain element, of a coupling stage that precedes a modulator stage having a multi-bit quantizer configured in the manner of the present invention, is set not only to ensure that the swing of an analog signal, received by integrators of the modulator stage, remains within the dynamic ranges of the operational amplifiers used to implement the integrators, but also to simplify the implementation of the noise cancellation logic stage.

Figure 19:
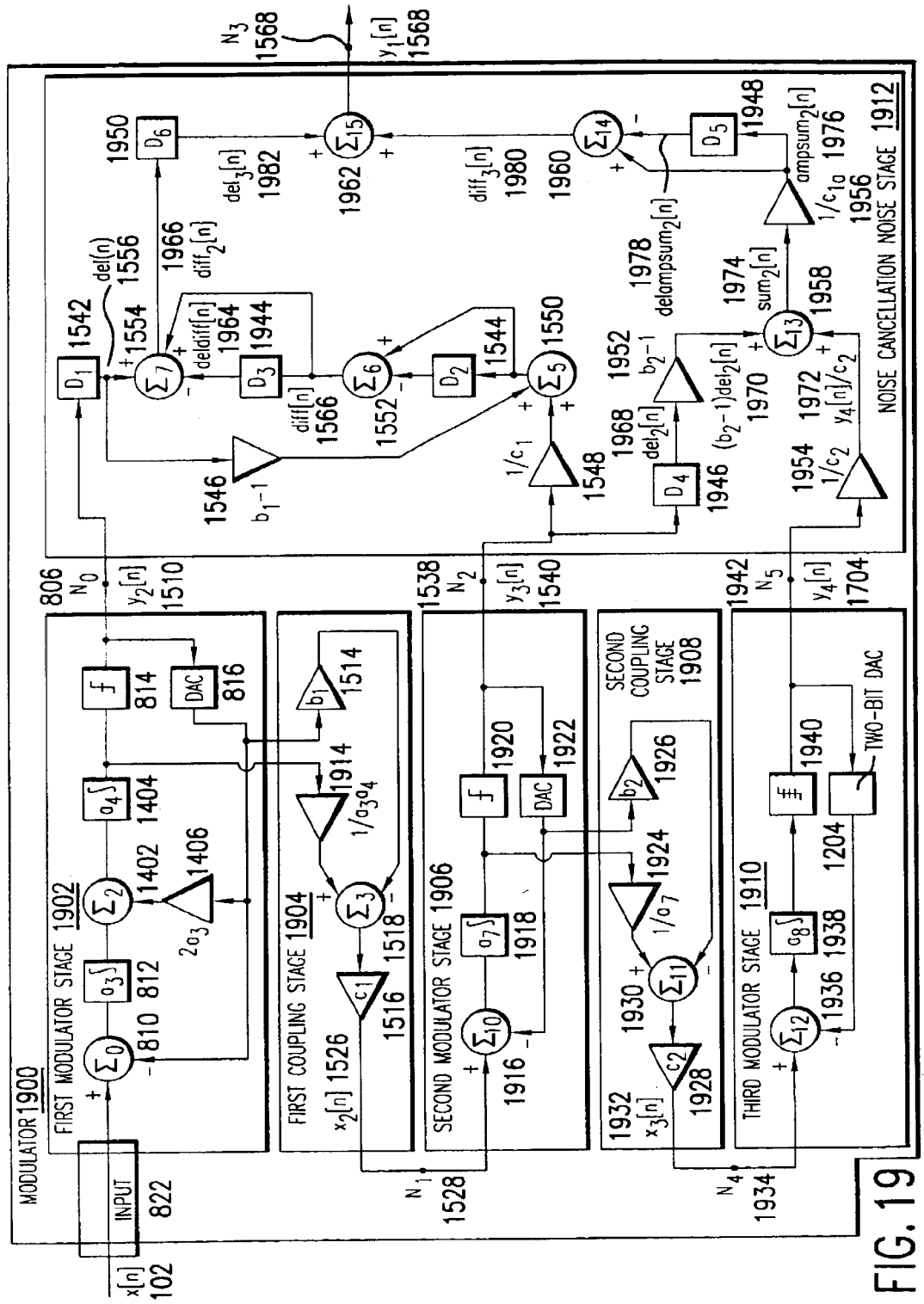
FIG. 19 is a block diagram of a 2-1-1 two-bit delta sigma modulator 1900 that embodies the present invention.

FIG. 19 is a block diagram of a 2-1-1 two-bit delta sigma modulator 1900 that embodies the present invention. Modulator 1900 comprises a first modulator stage 1902, a first coupling stage 1904, a second modulator stage 1906, a second coupling stage 1908, a third modulator stage 1910, and a noise cancellation logic stage 1912.

First modulator stage 1902 comprises first summing node $\Sigma_0$ 810, first integrator 812, second summing node $\Sigma_2$ 1402, second integrator 1404, first single-bit quantizer 814, first DAC 816, and higher order compensation gain element $2a_3$ 1406. These are configured in the same manner as modulator 1400. First integrator 812 has gain $a_3$. Second integrator 1404 has gain $a_4$. Higher order compensation gain element $2a_3$ 1406 has gain $2a_3$. Analog signal x[n] 102 is received by first modulator stage 1902, at input 822, and converted into first modulated signal $y_2[n]$ 1510, produced at node $N_0$ 806.

First coupling stage 1904 comprises a first normalization gain element "$1/a_3a_4$" 1914, first noise reduction gain element $b_1$ 1514, first stability correction gain element $c_1$ 1516, and third summing node $\Sigma_3$ 1518. These are configured in the same manner as coupling stage 1504. First normalization gain element $1/a_3a_4$ has a gain of "$1/a_3a_4$", the inverse of the product of gain $a_3$ of first integrator 812 and gain $a_4$ of second integrator 1404. First noise reduction gain element $b_1$ 1514 has gain $b_1$. First stability correction gain element $c_1$ 1516 has gain $c_1$. First coupling stage 1904 produces second analog signal $x_2[n]$ 1526 at node $N_1$ 1528.

Second modulator stage 1906 comprises a fourth summing node "$\Sigma_{10}$" 1916, a third integrator 1918, a second single-bit quantizer 1920, and a second DAC 1922. These are configured in the same manner as modulator 802. Third integrator 1918 has a gain of "$a_7$". Second analog signal $x_2[n]$ 1526 is received by second modulator stage 1906, at node $N_1$ 1528, and converted into second modulated signal $y_3[n]$ 1540, produced at node $N_2$ 1538.

Second coupling stage 1908 comprises a second normalization gain element "$1/a_7$" 1924, a second noise reduction gain element "$b_2$" 1926, a second stability correction gain element "$c_2$" 1928, and a fifth summing node "$\Sigma_{11}$" 1930. These are configured in the same manner as coupling stage 1504. Second normalization gain element $1/a_7$ has a gain of "$1/a_7$", the inverse of gain $a_7$ of third integrator 1918. Second noise reduction gain element $b_2$ 1926 has a gain of "$b_2$". Second stability correction gain element $c_2$ 1928 has a gain of 1. Second coupling stage 1908 produces a third analog signal "$x_3[n]$" 1932 at a node "$N_4$" 1934.

Third modulator stage 1910 comprises a sixth summing node "$\Sigma_{12}$" 1936, a fourth integrator 1938, a two-bit quantizer configured in the manner of the present invention 1940, and two-bit DAC 1204. These are configured in the same manner as modulator 1200. Fourth integrator 1938 has a gain of "$a_1$". Two-bit quantizer 1940 and two-bit DAC 1204 have a combined gain $k_4$ of "$1/a_1$", the inverse of gain $a_8$ of fourth integrator 1938. Third analog signal $x_3[n]$ 1932 is received by third modulator stage 1910, at node $N_4$ 1934, and converted into two-bit modulated signal $y_4[n]$ 1704, produced at a node "$N_5$" 1942.

Noise cancellation logic stage 1912 comprises first delay element $D_1$ 1542, second delay element $D_2$ 1544, a third delay element "$D_3$" 1944, a fourth delay element "$D_4$" 1946, a fifth delay element "$D_5$" 1948, a sixth delay element "$D_6$" 1950, first noise cancellation logic gain element ($b_1-1$) 1546, a second noise cancellation logic gain element "($b_2-1$)" 1952, first stability normalization gain element $1/c_1$ 1548, a second stability normalization gain element "$1/c_2$" 1954, a third stability normalization gain element "$1/c_{1a}$" 1956, seventh summing node $\Sigma_5$ 1550, eighth summing node $\Sigma_6$ 1552, ninth summing node $\Sigma_7$ 1554, a tenth summing node "$\Sigma_{13}$" 1958, an eleventh summing node "$\Sigma_{14}$" 1960, and a twelfth summing node "$\Sigma_{15}$" 1962.

First delay element $D_1$ 1542, second delay element $D_2$ 1544, first noise cancellation logic gain element ($b_1-1$) 1546, first stability normalization gain element $1/c_1$ 1548, seventh summing node $\Sigma_5$ 1550, eighth summing node $\Sigma_6$ 1552, and ninth summing node $\Sigma_7$ 1554 are configured in the same manner as noise cancellation logic stage 1508 with one exception.

The exception is that third delay element $D_3$ 1944 is connected between eighth summing node $\Sigma_6$ 1552 and ninth summing node $\Sigma_7$ 1554. This is because first modulator stage 1902 is a second order modulator. Third delay element $D_3$ 1944 receives difference modulated signal diff[n] 1566 and delays it by the processing period to produce a delayed difference modulated signal "deldiff[n]" 1964. Ninth summing node $\Sigma_7$ 1554 receives delayed difference modulated signal deldiff[n] 1964 and subtracts it from delayed modulated signal del[n] 1556 to produce a second difference modulated signal "diff$_2$[n]" 1966. Second difference modulated signal diff$_2$[n] 1966 relates to noise cancellation between first and second modulator stages 1902, 1906.

Fourth delay element $D_4$ 1946, second noise cancellation logic gain element ($b_2-1$) 1952, second stability normalization gain element $1/c_2$ 1954, and tenth summing node $\Sigma_{13}$ 1958 are used for noise cancellation between second and third modulator stages 1906, 1910. Fourth delay element $D_4$ 1946 receives second modulated signal $y_3[n]$ 1540 and delays it by the processing period to produce a second delayed modulated signal "del$_2$[n]" 1968. Second noise cancellation logic gain element ($b_2-1$) 1952 receives second delayed modulated signal del$_2$[n] 1968 and amplifies it by a gain of "($b_2-1$)", one less than gain $b_2$ of second noise reduction gain element $b_2$ 1926, to produce a second amplified delayed modulated signal "($b_2-1$)del$_2$[n]" 1970. This facilitates noise cancellation. Second stability normalization gain element $1/c_2$ 1954 receives two-bit modulated signal $y_4[n]$ 1704 and amplifies it by a gain "$1/c_2$", the inverse of gain $c_2$ of second stability correction gain element $c_2$ 1928, to produce an amplified two-bit modulated signal "$y_4[n]/c_2$" 1972. This normalizes two-bit modulated signal $y_4[n]$ 1704. Tenth summing node $\Sigma_3$ 1958 receives amplified two-bit modulated signal $y_4[n]/c_2$ 1972 and adds it to second amplified delayed modulated signal ($b_2-1$)del$_2$[n] 1970 to produce a second sum modulated signal "sum$_2$[n]" 1974. Second sum modulated signal sum$_2$[n] 1974 relates to noise cancellation between second and third modulator stages 1906, 1910.

Fifth delay element $D_5$ 1948, sixth delay element $D_6$ 1950, third stability normalization gain element $1/c_{1a}$ 1956, eleventh summing node $\Sigma_{14}$ 1960, and twelfth summing node $\Sigma_{14}$ 1962 are used for noise cancellation between second difference modulated signal diff$_2$[n] 1966 and second sum modulated signal sum$_2$[n] 1974. Third stability normalization gain element $1/c_{1a}$ 1956 receives second sum modulated signal sum$_2$[n] 1974 and amplifies it by gain $1/c_1$, the inverse of gain $c_1$ of first stability correction gain element $c_1$ 1516, to produce an amplified sum signal "ampsum$_2$[n]" 1976. Fifth delay element $D_5$ 1948 receives amplified sum signal ampsum$_2$[n] 1976 and delays it by the processing period to produce a delayed amplified sum signal "delampsum$_2$[n]" 1978. Eleventh summing node $\Sigma_{14}$ 1960 receives delayed amplified sum signal delampsum$_2$[n] 1978 and subtracts it from amplified sum signal ampsum$_2$[n] 1976 to produce a third difference modulated signal "diff$_3$[n]" 1980. Sixth delay element $D_6$ 1950 receives second difference modulated signal diff$_2$[n] 1966 and delays it by the processing period to produce a third delayed modulated signal "del$_3$[n]" 1982. Twelfth summing node $\Sigma_{14}$ 1962 receives third delayed modulated signal del$_3$[n] 1982 and adds it to third difference modulated signal diff$_3$[n] 1980 to produce two-bit quantized signal $y_1[n]$ 1206.

Thus, first modulated signal $y_2[n]$ 1510, second modulated signal $y_3[n]$ 1540, and two-bit modulated signal $y_4[n]$ 1704 are received by noise cancellation logic stage 1912, respectively at nodes $N_0$ 806, $N_2$ 1538, and $N_5$ 1942, and converted into two-bit quantized signal $y_1[n]$ 1206, produced at node $N_3$ 1568. Similar to the expression shown in Eq. (13) for two-bit quantized signal $y_1[n]$ 1206 produced by modulator 1700, two-bit quantized signal $y_1[n]$ 1206 produced by modulator 1900 can be expressed as shown in Eq. (14):

$$y_1[n]=x[n]z^{-4}+n_3[n]/c_1c_2(1-z^{-1})^4, \qquad \text{Eq. (14)}$$

where "$n_3[n]$" is a third quantization noise produced by third modulator stage 1910.

Figure 20A:
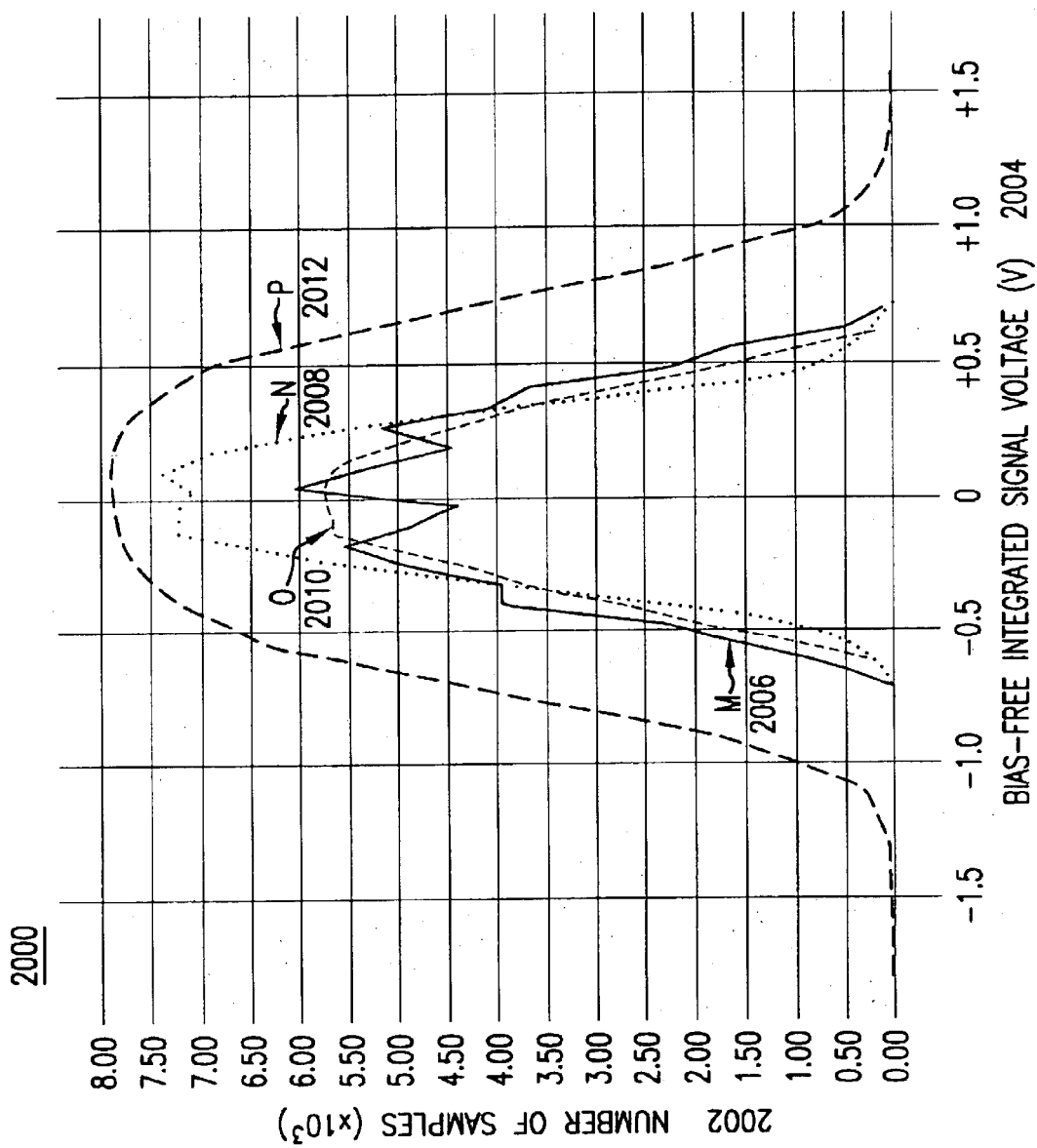
FIG. 20A is a graph 2000 of histograms for integrated signals (e.g., v[n] 826) produced by the integrators of a model of a 2-1-1 delta sigma modulator having two-bit quantizer 1202.

FIG. 20A is a graph 2000 of histograms for integrated signals (e.g., v[n] 826) produced by the integrators of a model of a 2-1-1 delta sigma modulator having two-bit quantizer 1202. Graph 2000 comprises a "number of samples" axis 2002 and a "bias-free integrated signal voltage" axis 2004. Bias-free integrated signal voltage axis 2004 is centered at a value measuring one-half of the range of the integrated signal voltages. The model from which graph 2000 is derived assumed a three volt power supply range. The model set gain $c_2$ of second stability correction gain element $c_2$ 1928 equal to one, gain $a_8$ of fourth integrator 1938 equal to one, and combined gain $k_4$ of two-bit quantizer 1202 and two-bit DAC 1204 equal to one. Graph 2000 further comprises a histogram "M" 2006 for samples of an integrated signal produced by first integrator 812 of first modulator stage 1902, a histogram "N" 2008 for samples of an integrated signal produced by second integrator 1404 of first modulator stage 1902, a histogram "O" 2010 for samples of an integrated signal produced by third integrator 1918 of second modulator stage 1906, and a histogram "P" 2012 for samples of an integrated signal produced by fourth integrator 1938 of third modulator stage 1910.

As the integrators in the model would be implemented using operational amplifiers, some of the three volt power supply range would be consumed to support holding active load devices and current sources of these operational amplifiers in saturation. The swing of integrated signals produced by these integrators must be limited to the dynamic range of the operational amplifiers, which must be less than three volts. Unfortunately, histogram P 2012 shows that the swing of the bias-free integrated signal produced by fourth integrator 1938 ranges from −1.5 volts to +1.5 volts, and therefore exceeds the dynamic range of the operational amplifier that implements fourth integrator 1938.

Figure 20B:
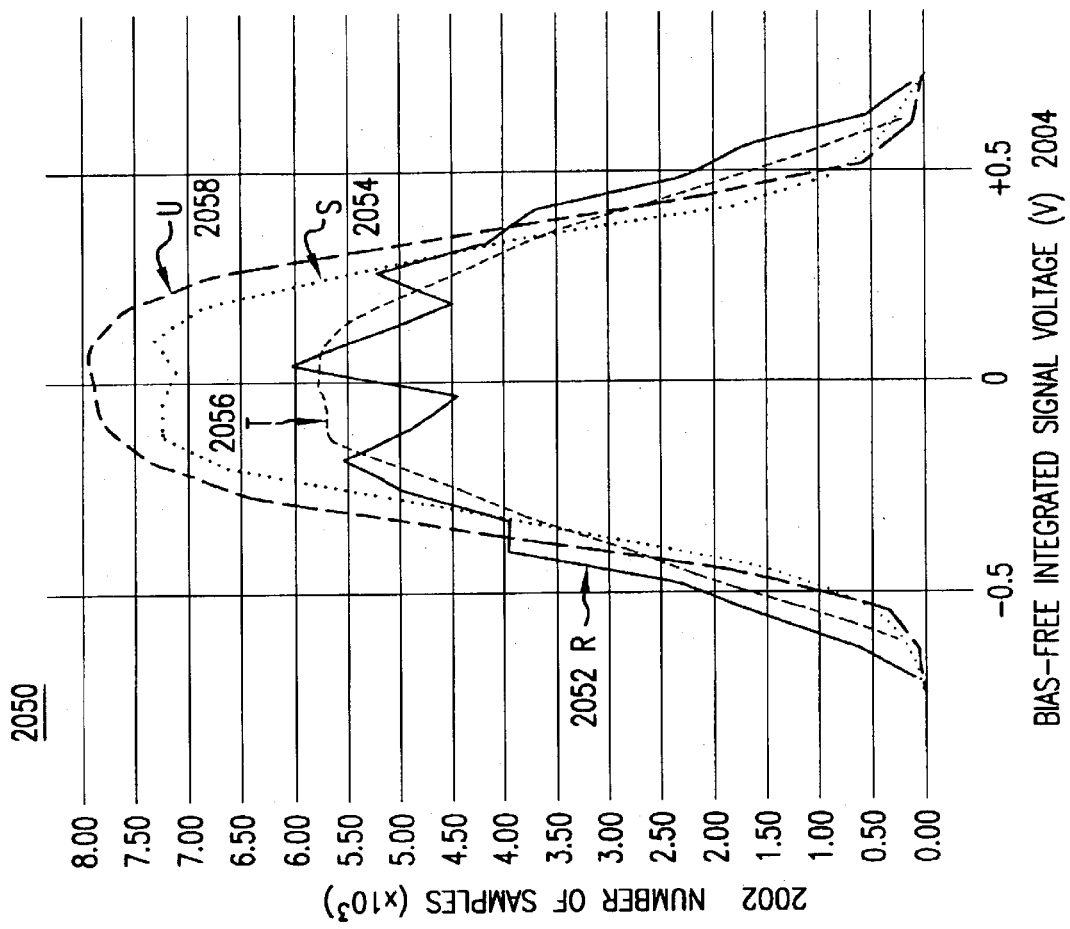
FIG. 20B is a graph 2050 of histograms for integrated signals (e.g., v[n] 826) produced by the integrators of a model of a 2-1-1 delta sigma modulator having two-bit quantizer_configured in the manner of the present invention 1940.

FIG. 20B is a graph 2050 of histograms for integrated signals (e.g., v[n] 826) produced by the integrators of a model of a 2-1-1 delta sigma modulator having two-bit quantizer configured in the manner of the present invention 1940. Graph 2050 likewise comprises number of samples axis 2002 and bias-free integrated signal voltage axis 2004. Bias-free integrated signal voltage axis 2004 is centered at a value measuring one-half of the range of the integrated signal voltages. The model from which graph 2050 is derived assumed a three volt power supply range. The model set gain $c_2$ of second stability correction gain element $c_2$ 1928 equal to one, gain $a_8$ of fourth integrator 1938 equal to one-half, and combined gain $k_4$ of two-bit quantizer 1940 and two-bit DAC 1204 equal to two. Graph 2050 further comprises a histogram "R" 2052 for samples of an integrated signal produced by integrator 812 of first modulator stage 1902, a histogram "S" 2054 for samples of an integrated signal produced by integrator 1404 of first modulator stage 1902, a histogram "T" 2056 for samples of an integrated signal produced by integrator 1918 of second modulator stage 1906, and a histogram "U" 2058 for samples of an integrated signal produced by integrator 1938 of third modulator stage 1910. The histograms of graph 2050 show swings of bias-free integrated signals that range from −0.75 volts to +0.75 volts. These swings are within the expected dynamic ranges of the operational amplifiers that would be used to implement the integrators.

Figure 21:
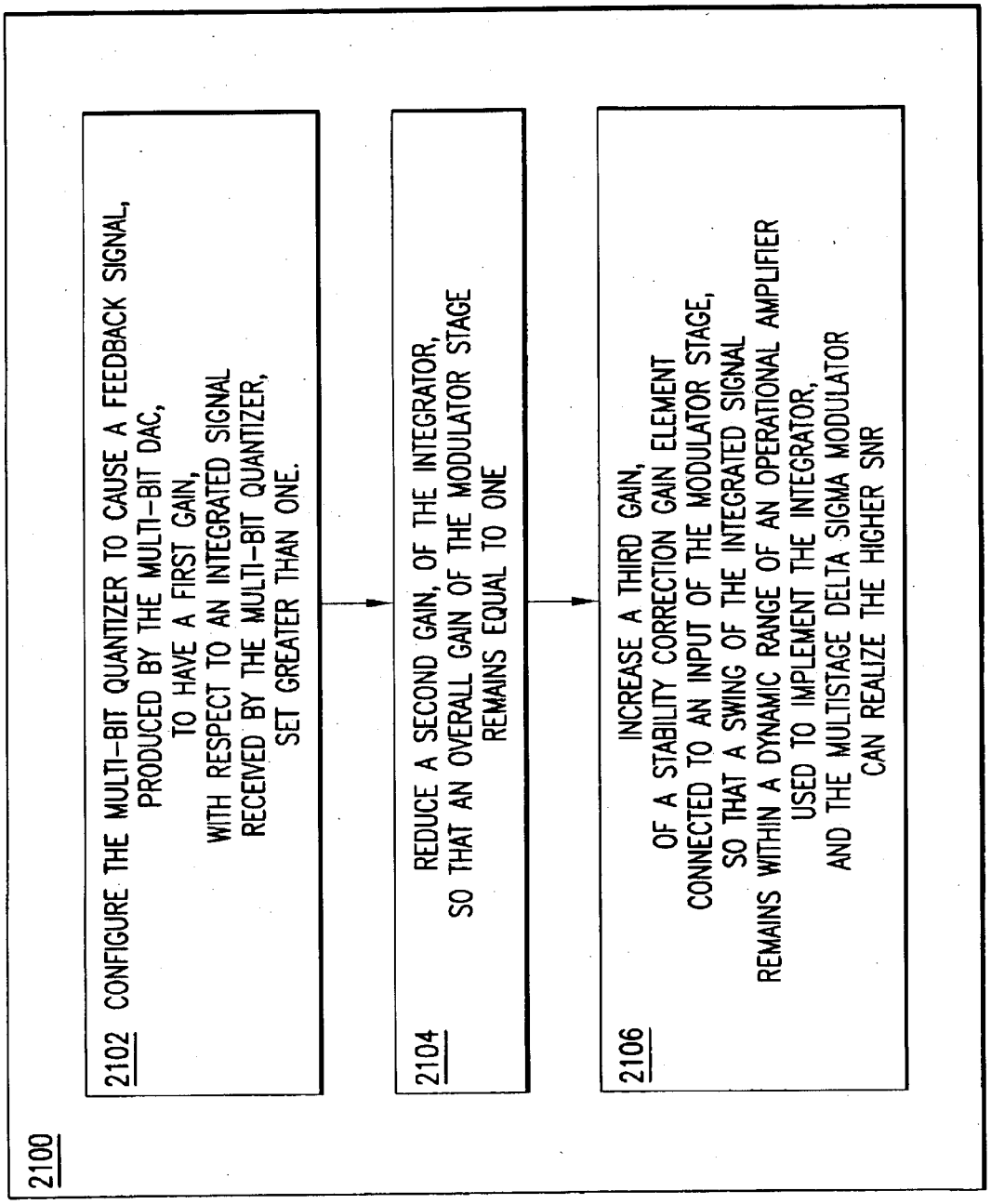
FIG. 21 shows a flow chart of a method 2100 of gain scaling components of a multistage delta sigma modulator having a modulator stage with an integrator, a multi-bit quantizer, and a multi-bit digital-to-analog convertor to realize a higher signal-to-noise ratio.

FIG. 21 shows a flow chart of a method 2100 of gain scaling components of a multistage delta sigma modulator, having a modulator stage with an integrator, a multi-bit quantizer, and a multi-bit DAC, to realize a higher SNR. At a step 2102, the multi-bit quantizer is configured to cause a feedback signal, produced by the multi-bit DAC, to have a first gain, with respect to an integrated signal received by the multi-bit quantizer, set greater than one. At a step 2104, a second gain, of the integrator, is reduced so that an overall gain of the modulator stage remains equal to one. At a step 2106, a third gain, of a stability correction gain element connected to an input of the modulator stage, is increased so that the swing of the integrated signal remains within a dynamic range of an operational amplifier used to implement the integrator, and the multistage delta sigma modulator can realize the higher SNR. Preferably, but not by way of limitation, the third gain is set equal to a power of two.

Figure 22:
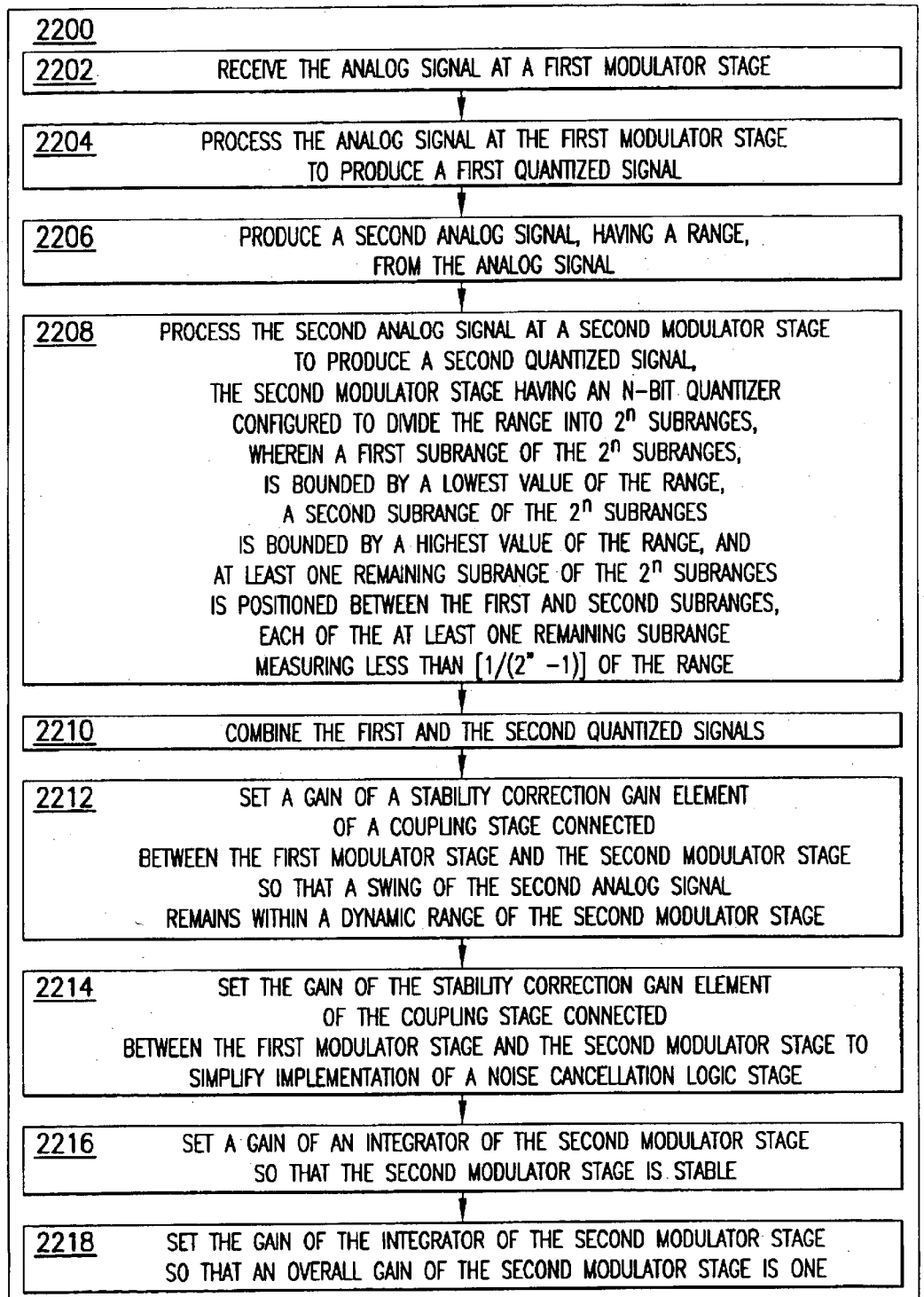
FIG. 22 shows a flow chart of a method 2200 of quantizing an analog signal with a multistage delta sigma modulator.

FIG. 22 shows a flow chart of a method 2200 of quantizing an analog signal with a multistage delta sigma modulator. At a step 2202, the analog signal is received at a first modulator stage. At a step 2204, the analog signal is processed at the first modulator stage to produce a first quantized signal. At a step 2206, a second analog signal is produced from the analog signal. The second analog signal has a range within which a parameter (e.g., voltage) varies continuously with time. At a step 2208, the second analog signal is processed at a second modulator stage to produce a second quantized signal. The second modulator stage has an n-bit quantizer configured to divide the range into $2^n$ subranges. A first subrange of the $2^n$ subranges is bounded by a lowest value of the range. A second subrange of the $2^n$ subranges is bounded by a highest value of the range. At least one remaining subrange is positioned between the first and the second subranges. Each of the first and the second subranges measures greater than $\{1/[2(2^n-1)]\}$ of the range. Each of the at least one remaining subrange measures less than $[1/(2^n-1)]$ of the range. At a step 2210, the first and second quantized signals are combined.

In one embodiment, method 2200 can further comprise a step 2212. At step 2212, a gain of a stability correction gain element of a coupling stage connected between the first modulator stage and the second modulator stage is set so that a swing of the second analog signal remains within a dynamic range of the second modulator stage. Preferably, the gain is the highest gain that allows the swing of the second analog signal to remain within the dynamic range of the second modulator stage.

In another embodiment, method 2200 can further comprise a step 2214. At step 2214, the gain of the stability correction gain element of the coupling stage connected between the first modulator stage and the second modulator stage is set to simplify implementation of a noise cancellation logic stage. Preferably, the gain is a power of two.

In yet another embodiment, method 2200 can further comprise a step 2216. At step 2216, a gain of an integrator of the second modulator stage is set so that the second modulator stage is stable. Preferably, the gain is the lowest gain for which the second modulator stage is stable.

In still another embodiment, method 2200 can further comprise a step 2218. At step 2218, the gain of the integrator of the second modulator stage is set so that an overall gain of the second modulator stage is one.

FIG. 23 shows a flow chart of a method 2300 of realizing a higher signal-to-noise ratio in a multistage, n-bit delta sigma modulator. At a step 2302, an n-bit quantizer of a downstream modulator stage is configured to produce an n-bit quantized signal from an analog signal having a range. The n-bit quantizer divides the range into $2^n$ subranges. A first subrange of the $2^n$ subranges is bounded by a lowest value of the range. A second subrange of the $2^n$ subranges is bounded by a highest value of the range. At least one remaining subrange is positioned between the first and the second subranges. Each of the first and the second subranges measures greater than $\{1/[2(2^n-1)]\}$ of the range. Each of the at least one remaining subrange measures less than $[1/(2^n-1)]$ of the range. At a step 2304, a first gain of an integrator of the downstream modulator stage is set so that the downstream modulator stage is stable. Preferably, the first gain is the lowest gain for which the downstream modulator stage is stable. At a step 2306, a second gain of a stability correction gain element of a coupling stage connected to the downstream modulator stage is set so that a swing of the analog signal remains within a dynamic range of the downstream modulator stage. Preferably, the second gain is the highest gain that allows the swing of the analog signal to remain within the dynamic range of the downstream modulator stage. Optionally, the second gain simplifies implementation of a noise cancellation logic stage.

Figure 24:
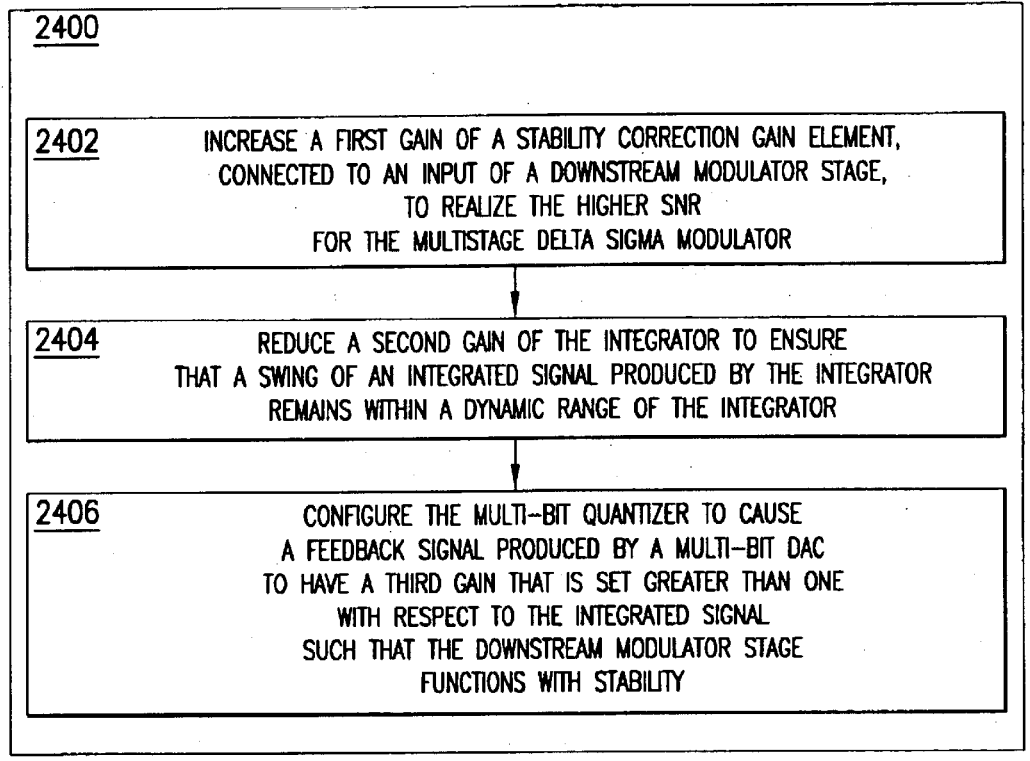
FIG. 24 shows a flow chart of a method 2400 of gain scaling components of a multistage delta sigma modulator having a downstream modulator stage with an integrator, a multi-bit quantizer, and a multi-bit DAC, to realize a higher SNR.

FIG. 24 shows a flow chart of a method 2400 of gain scaling components of a multistage delta sigma modulator having a downstream modulator stage with an integrator, a multi-bit quantizer, and a multi-bit DAC, to realize a higher SNR. At a step 2402, a first gain of a stability correction gain element, connected to an input of the downstream modulator stage, is increased to realize the higher signal-to-noise ratio for the multistage delta sigma modulator. Preferably, the first gain is set equal to a power of two. At a step 2404, a second gain of the integrator is reduced to ensure that a swing of an integrated signal produced by the integrator remains within a dynamic range of the integrator. At a step 2406, the multi-bit quantizer is configured to cause a feedback signal produced by the multi-bit DAC to have a third gain that is set greater than one with respect to the integrated signal such that the downstream modulator stage functions with stability.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A multistage delta sigma modulator, comprising:
    a first modulator stage having an input capable of receiving an analog signal;
    a coupling stage connected to said first modulator stage, and having a stability correction gain element;
    a second modulator stage connected to said coupling stage, and having an integrator, a linear n-bit quantizer, and a linear n-bit digital-to-analog converter; and
    a noise cancellation logic stage connected to said first modulator stage and said second modulator stage, and having an output;
    wherein:
        said coupling stage is configured to produce a second analog signal having a range; and
        said linear n-bit quantizer is configured to produce an n-bit quantized signal such that said n-bit quantizer divides said range into $2^n$ subranges, wherein a first subrange of said $2^n$ subranges is bounded by a lowest value of said range, a second subrange of said $2^n$ subranges is bounded by a highest value of said range, and at least one remaining subrange of said $2^n$ subranges is positioned between said first and said second subranges, said first and said second subranges each measuring greater than $\{1/[2(2^n-1)]\}$ of said range, each of said at least one remaining subrange measuring less than $[1/(2^n-1)]$ of said range;
    said linear n-bit quantizer is capable of causing a feedback analog signal, produced by said linear n-bit digital-to-analog convertor, to have a first gain that is greater than one with respect to an integrated signal received by said linear n-bit quantizer;
    said integrator has a second gain that causes an overall gain of said second modulator stage to be equal to one; and
    said stability correction gain element has a third gain determined so that a swing of said integrated signal remains within a dynamic range of said integrator.

2. The multistage delta sigma modulator of claim 1, wherein each of said at least one remaining subrange measures $\{1/[2(2^n-1)]\}$ of said range.

3. The multistage delta sigma modulator of claim 1, wherein n is an integer.

4. The multistage delta sigma modulator of claim 1, wherein said third gain is a highest that allows said swing of said integrated signal to remain within said dynamic range of said integrator.

5. The multistage delta sigma modulator of claim 1, wherein said third gain is determined to simplify implementation of said noise cancellation logic stage.

6. The multistage delta sigma modulator of claim 5, wherein said third gain is a power of two.

7. The multistage delta sigma modulator of claim 1, wherein said integrator comprises a plurality of integrators and said second gain comprises a plurality of second gains.

8. The multistage delta sigma modulator of claim 1, wherein said first modulator stage comprises a plurality of modulator stages, and wherein said coupling stage comprises a plurality of coupling stages.

9. The multistage delta sigma modulator of claim 1, wherein said first modulator stage has a single-bit quantizer.

10. The multistage delta sigma modulator of claim 1, wherein said first modulator stage has a plurality of integrators.

11. A multistage delta sigma modulator, comprising:
    a first modulator stage having an input capable of receiving an analog signal;
    a coupling stage connected to said first modulator stage, and having a stability correction gain element;
    a second modulator stage connected to said coupling stage, and having an integrator, a linear n-bit quantizer, and a linear n-bit digital-to-analog converter; and
    a noise cancellation logic stage connected to said first modulator stage and said second modulator stage, and having an output;
    wherein:
        said coupling stage is configured to produce a second analog signal having a range; and
        said linear n-bit quantizer is configured to produce an n-bit quantized signal such that said n-bit quantizer divides said range into $2^n$ subranges, wherein a first subrange of said $2^n$ subranges is bounded by a lowest value of said range, a second subrange of said $2^n$ subranges is bounded by a highest value of said range, and at least one remaining subrange of said $2^n$ subranges is positioned between said first and said second subranges, each of said at least one remaining subrange measuring less than $[1/(2^n-1)]$ of said range;
        said linear n-bit quantizer is capable of causing a feedback analog signal, produced by said linear n-bit digital-to-analog convertor in response to said n-bit quantized signal, to have a gain that is greater than one with respect to an integrated signal received by said linear n-bit quantizer.

12. In a multistage delta sigma modulator having a modulator stage with an integrator, a linear multi-bit quantizer, and a linear multi-bit digital-to-analog converter, a method of gain scaling components of the multistage delta sigma modulator to realize a higher signal-to-noise ratio, comprising the steps of:
    (1) configuring the linear multi-bit quantizer to cause a feedback signal, produced by the linear multi-bit digital-to-analog converter, to have a first gain, with respect to an integrated signal received by the linear multi-bit quantizer, set greater than one;
    (2) reducing a second gain, of the integrator, so that an overall gain of the modulator stage remains equal to one; and
    (3) increasing a third gain, of a stability correction gain element connected to an input of the modulator stage, so that a swing of the integrated signal remains within a dynamic range of an operational amplifier used to implement the integrator, and the multistage delta sigma modulator can realize the higher signal-to-noise ratio.

13. The method of claim 12, wherein the third gain is set equal to a power of two.

14. A method of quantizing an analog signal with a multistage delta sigma modulator, comprising the steps of:
   (1) receiving the analog signal at a first modulator stage;
   (2) processing the analog signal at the first modulator stage to produce a first quantized signal;
   (3) producing a second analog signal from the analog signal, the second analog signal having a range;
   (4) processing the second analog signal at a second modulator stage to produce a second quantized signal, the second modulator stage having a linear n-bit quantizer configured to divide the range into $2^n$ subranges and a linear n-bit digital-to-analog converter, wherein a first subrange of the $2^n$ subranges is bounded by a lowest value of the range, a second subrange of the $2^n$ subranges is bounded by a highest value of the range, and at least one remaining subrange of said $2^n$ subranges is positioned between said first and said second subranges, each of said at least one remaining subrange measuring less than $[1/(2^n-1)]$ of said range, wherein the linear n-bit quantizer is capable of causing a feedback analog signal, produced by the linear n-bit digital-to-analog convertor in response to the second quantized signal, to have a gain that is greater than one with respect to an integrated signal received by the linear n-bit quantizer; and
   (5) combining the first and the second quantized signals.

15. The method of claim 14, further comprising the step of:
   (6) setting a gain of a stability correction gain element of a coupling stage connected between the first modulator stage and the second modulator stage so that a swing of said second analog signal remains within a dynamic range of the second modulator stage.

16. The method of claim 15, wherein the gain is a highest gain that allows the swing of said second analog signal to remain within the dynamic range of the second modulator stage.

17. The method of claim 14, further comprising the step of:
   (6) setting a gain of a stability correction gain element of a coupling stage connected between the first modulator stage and the second modulator stage to simplify implementation of a noise cancellation logic stage.

18. The method of claim 17, wherein the gain is a power of two.

19. The method of claim 14, further comprising the step of:
   (6) setting a gain of an integrator of the second modulator stage so that the second modulator stage is stable.

20. The method of claim 19, wherein the gain is a lowest gain for which the second modulator stage is stable.

21. The method of claim 14, further comprising the step of:
   (6) setting a gain of an integrator of the second modulator stage so that an overall gain of the second modulator stage is one.

22. A method of realizing a higher signal-to-noise ratio in a multistage, n-bit delta sigma modulator, comprising the steps of:
   (1) configuring a linear n-bit quantizer of a downstream modulator stage to produce an n-bit quantized signal from an analog signal having a range such that the linear n-bit quantizer divides the range into $2^n$ subranges, wherein a first subrange of the $2^n$ subranges is bounded by a lowest value of the range, a second subrange of the $2^n$ subranges is bounded by a highest value of the range, and at least one remaining subrange of said $2^n$ subranges is positioned between said first and said second subranges, each of said at least one remaining subrange measuring less than $[1/(2^n-1)]$ of said range;
   (2) setting a first gain of an integrator of the downstream modulator stage so that the downstream modulator stage is stable; and
   (3) setting a second gain of a stability correction gain element of a coupling stage connected to the downstream modulator stage so that a swing of the analog signal remains within a dynamic range of the downstream modulator stage;
   wherein:
      the linear n-bit quantizer is capable of causing a feedback analog signal, produced by a linear n-bit digital-to-analog convertor of the downstream modulator stage in response to the n-bit quantized signal, to have a gain that is greater than one with respect to an integrated signal received by the linear n-bit quantizer.

23. The method of claim 22, wherein the first gain is a lowest gain for which the downstream modulator stage is stable.

24. The method of claim 22, wherein the second gain is a highest gain that allows the swing of the analog signal to remain within the dynamic range of the downstream modulator stage.

25. The method of claim 22, wherein the second gain simplifies implementation of a noise cancellation logic stage.

26. In a multistage delta sigma modulator having a downstream modulator stage with an integrator, a linear multi-bit quantizer, and a linear multi-bit digital-to-analog converter, a method of gain scaling components of the multistage delta sigma modulator to realize a higher signal-to-noise ratio, comprising the steps of:
   (1) increasing a first gain of a stability correction gain element, connected to an input of the downstream modulator stage, to realize the higher signal-to-noise ratio for the multistage delta sigma modulator;
   (2) reducing a second gain of the integrator to ensure that a swing of an integrated signal produced by the integrator remains within a dynamic range of the integrator; and
   (3) configuring the linear multi-bit quantizer to cause a feedback signal produced by the linear multi-bit digital-to-analog converter to have a third gain that is set greater than one with respect to the integrated signal such that the downstream modulator stage functions with stability.

27. The method of claim 26, wherein the first gain is set equal to a power of two.

* * * * *